(12) United States Patent
Ohzeki

(10) Patent No.: US 6,184,596 B1
(45) Date of Patent: Feb. 6, 2001

(54) STAGE CONSTRUCTION INCORPORATING MAGNETICALLY LEVITATED MOVABLE STAGE

(75) Inventor: Hisao Ohzeki, Kawagoe (JP)

(73) Assignee: Nikon Corporation, Tokyo (JP)

(*) Notice: Under 35 U.S.C. 154(b), the term of this patent shall be extended for 0 days.

(21) Appl. No.: 08/998,038

(22) Filed: Dec. 23, 1997

Related U.S. Application Data

(62) Division of application No. 08/672,551, filed on Jun. 28, 1996.

(30) Foreign Application Priority Data

Jun. 30, 1995 (JP) .................................................... 7-166342
Jun. 30, 1995 (JP) .................................................... 7-166343
Jun. 30, 1995 (JP) .................................................... 7-166345

(51) Int. Cl.[7] .................................................. H02K 41/02
(52) U.S. Cl. .......................................................... 310/12
(58) Field of Search ............................ 310/12, 13, 54, 310/52, 10

(56) References Cited

U.S. PATENT DOCUMENTS

| 3,405,290 | * | 10/1968 | Halas | 310/10 |
| 3,609,418 | * | 9/1971 | Halas | 310/10 |
| 4,058,746 | * | 11/1977 | Mole et al. | 310/10 |
| 5,747,426 | * | 5/1998 | Abboud | 310/90.5 |

* cited by examiner

Primary Examiner—Clayton LaBalle
(74) Attorney, Agent, or Firm—Pillsbury Madison & Sutro LLP

(57) ABSTRACT

The stage construction of the present invention includes a fixed stage and a magnetically levitated movable stage which is driven in mutually perpendicular X, Y, and Z axis directions with respect to the fixed stage by magnetic action between itself and the fixed stage. The fixed stage includes a magnet and a closed plenum in which the magnet is sealed. The movable stage includes a magnetic material which is opposed to the magnet and which experiences an attractive or repulsive magnetic force with respect to the magnet.

48 Claims, 30 Drawing Sheets

STAGE CONSTRUCTION INCORPORATING MAGNETICALLY LEVITATED MOVABLE STAGE

This is a division of application Ser. No. 08/672,551, filed Jun. 28, 1996.

BACKGROUND OF THE INVENTION

1. Field of the Invention

The present invention relates to a stage construction incorporating a movable stage whose position can be fixed, which is used in a semiconductor exposure device or in a sample analysis device such as a photoelectron spectroscopy device, an X ray microscope, an electron microscope, or the like.

2. Description of the Prior Art

When performing exposure of a wafer using a semiconductor exposure device, it is necessary to fix the position of the wafer accurately with regard to its six spatial degrees of freedom, conventionally designated as X, Y, Z, θ, α, and β. Further, in a photoelectron spectroscopy device, an X ray microscope, an electron microscope, or the like, in the same manner it is necessary to fix the position of the sample for analysis accurately with regard to its six degrees of freedom. In this field, in the prior art, assemblies of stages with 1-axis movement, 2-axis movement, or 3-axis movement have been superposed in combination as required, so that the combination can be utilized as a six axis stage construction. Such stages achieve the desired accuracy of position fixing by incorporating suitable assemblies, including driving mechanisms such as linking mechanisms, ball screws, planetary screws, linear screws, or the like, speed reducing mechanisms such as gears or the like, and friction bearings such as cross roller guides, V-flat sliding groove guides and the like.

However, reduction in mass is difficult to realize for such prior art stage constructions, due to the bulk of the main body of the stage construction becoming large. Accordingly the inertia of the movable parts of such a stage construction becomes great, so that it is difficult to increase the speed of their movement, and also improvement of the accuracy of position fixing becomes difficult. Further, due to the existence of at least two faces which are in sliding mechanical contact, one upon a fixed stage and one upon a movable stage, the cleanliness of the environment provided by such a stage construction is inevitably deteriorated due to generation of dust from the movement mechanism. Yet further, if the stage construction is to be used under high vacuum conditions, the problem arises that the vacuum level will be reduced, since lubricant needs to be used between these mechanically contacting faces.

In order to implement non-contact operation of such a stage construction, it is possible to levitate the movable stage by floating it upon air bearings, and to drive it using a linear motor; but the cleanliness of the environment is degraded since the air gushing out from the air bearing will inevitably stir up dust, and for example the yield rate of a semiconductor process utilizing this stage construction is deteriorated. Furthermore, due to the use of a flow of air for levitating the movable stage, it is fundamentally impossible to apply this expedient to a stage which is intended to operate under vacuum conditions.

SUMMARY OF THE INVENTION

The objective of the present invention is to propose a stage construction incorporating a magnetically levitated movable stage which, along with making possible high speed movement and high accuracy positioning of the movable stage due to reduction in its mass, can also be used under vacuum conditions without any compromise of environmental cleanliness.

In order to attain the above described objective, the present invention proposes, according to a first aspect thereof, a stage construction incorporating a magnetically levitated movable stage, comprising a fixed stage and a magnetically levitated movable stage which is driven in mutually perpendicular X, Y, and Z axis directions with respect to the fixed stage by magnetic action between the movable stage and the fixed stage, the Z axis direction being a direction in which the fixed stage and the movable stage are lined up. And the fixed stage comprises a magnet and a closed plenum in which the magnet is sealed, while the movable stage comprises a magnetic material which is opposed to the magnet and which experiences an attractive or repulsive magnetic force with respect to the magnet.

The portion of the fixed stage which is located between the magnet and the magnetic material may desirably be made from a material of low magnetic permeability.

Further, in order to attain the above described objective, the present invention proposes, according to another aspect thereof, a stage construction, incorporating a magnetically levitated movable stage, comprising a fixed stage and a magnetically levitated movable stage which is driven in mutually perpendicular X, Y, and Z axis directions with respect to the fixed stage by magnetic action between itself and the fixed stage. And the fixed stage comprises an electromagnet and a closed plenum in which the electromagnet is sealed, while the movable stage comprises a magnetic material which is opposed to the electromagnet and which experiences an attractive or repulsive magnetic force with respect to the electromagnet.

In this case as well, the portion of the fixed stage which is located between the electromagnet and the magnetic material may desirably be made from a material of low magnetic permeability.

Further, it is also desirable to supply a coolant medium to the plenum, and also to cover a surface of the electromagnet with a material which has a high coefficient of thermal conductivity.

It is also beneficial to supply the coolant medium to a coolant conduit which is provided between the plenum of the fixed stage and a surface of the fixed stage which opposes the movable stage. In this case, it is desirable to make this coolant conduit from a material which has low magnetic permeability.

Further, in order to attain the above described objective, the present invention proposes, according to another aspect thereof, a stage construction incorporating a magnetically levitated movable stage, comprising a fixed stage and a magnetically levitated movable stage which is driven with respect to the fixed stage by magnetic action between the movable stage and the fixed stage in mutually perpendicular X, Y, and Z linear directions and in α, β, and θ rotational directions respectively defined around the X, Y, and Z directions. And driving force is exerted upon the movable stage along the Z linear direction, and in the a rotational direction and in the β rotational direction, by attractive or repulsive magnetic force which is generated between a first group of magnets provided to one of the movable stage and the fixed stage and a first group of electromagnets provided to the other of the stages, while driving force is exerted upon the movable stage along the X linear direction and the Y linear direction, and in the θ rotational direction, by crosswise current flow in an electrical conductor provided in the other of the stages crosswise to and within magnetic flux which is generated between a second group of magnets provided to the one of the stages and a second group of electromagnets provided to the other of the stages.

In this case, it is desirable for each electromagnet comprised in the second group of electromagnets to comprise a first coil wound around the Z linear direction and a second coil wound around a direction perpendicular thereto, with the electrical conductor within which the crosswise current flows being comprised in the second coil.

Or, it is desirable for each electromagnet comprised in the second group of electromagnets to comprise a first coil wound around the Z linear direction, a second coil wound around a direction perpendicular thereto, and a third coil wound around a direction perpendicular both to the Z linear direction and also to the perpendicular direction, while the electrical conductor within which the crosswise current flows is comprised in the second coil and/or in the third coil.

The movable stage may desirably be driven over the fixed stage, with a magnet which only generates attractive magnetic force being included within the first group of magnets.

Further, this stage construction may desirably also comprise a first measurement means, fitted to one of the movable stage and the fixed stage, which outputs measured values corresponding to amounts of movement of the movable stage along the Z linear direction, in the a rotational direction, and in the β rotational direction; and a first control means which receives the measured values from the first measurement means and controls flow of electrical current in the first group of electromagnets.

Or, this stage construction may desirably also comprise a second measurement means which outputs measured values corresponding to amounts of movement of the movable stage along the X linear direction, along the Y linear direction, and in the θ rotational direction; and a second control means which receives the measured values from the second measurement means and controls the crosswise current flow in the electrical conductor and/or the flow of electrical current in the second group of electromagnets.

Or, the above described stage construction may desirably also comprise a second measurement means which outputs measured values corresponding to amounts of movement of the movable stage along the X linear direction, along the Y linear direction, and in the θ rotational direction; and a second control means which receives the measured values from the second measurement means, selects from among the electromagnets which are fitted to the fixed stage or to the movable stage certain electromagnets to be used as the first group of electromagnets, and sets the direction of current flow in each the selected electromagnet. In this case, the second measurement means may desirably comprise a Hall effect sensor which is fitted to the fixed stage or to the movable stage.

Or, the above described stage construction may desirably also comprise a second measurement means which outputs measured values corresponding to amounts of movement of the movable stage along the X linear direction, along the Y linear direction, and in the θ rotational direction; and a second control means which receives the measured values from the second measurement means, selects from among the electromagnets which are fitted to the fixed stage or to the movable stage certain electromagnets to be used as the second group of electromagnets, and sets a direction of current flow in each the selected electromagnet. In this case, again, the second measurement means may desirably comprise a Hall effect sensor which is fitted to the fixed stage or to the movable stage.

Moreover, desirably, the above described one of the stages may be the movable stage, and the other of the stages may be the fixed stage.

Further, in order to attain the above described objective, the present invention proposes, according to another aspect thereof, a stage construction comprising a fixed stage and a magnetically levitated movable stage which is driven with respect to the fixed stage by magnetic action between the movable stage and the fixed stage in mutually perpendicular X, Y, and Z linear directions and in α, β, and θ rotational directions respectively defined around the X, Y, and Z directions, the Z axis direction being a direction in which the fixed stage and the movable stage are lined up, wherein magnetic flux is generated by a group of magnets provided to one of the movable stage and the fixed stage, and driving force is exerted upon the movable stage along the Z linear direction by current flow in an electrical conductor provided upon the other of the movable stage and the fixed stage within the magnetic flux.

In this case, desirably the electrical conductor may be a part of a coil which is wound around an axis in a direction perpendicular to the Z linear direction.

Further, in order to attain the above described objective, the present invention proposes, according to another aspect thereof, a stage construction incorporating a magnetically levitated movable stage, comprising: a fixed stage and a magnetically levitated movable stage which is driven with respect to the fixed stage by magnetic action between the movable stage and the fixed stage in mutually perpendicular X, Y, and Z linear directions and in α, β, and θ rotational directions respectively defined around the X, Y, and Z directions, the Z axis direction being a direction in which the fixed stage and the movable stage are lined up; a group of magnets provided to one of the movable stage and the fixed stage; a first coil, provided to the other of the movable stage and the fixed stage, which is wound upon a core around an axis in a direction perpendicular to the Z linear direction; and a second coil wound around the core around an axis in a direction perpendicular both to the Z linear direction and to the axis around which the first coil is wound; wherein driving force is exerted upon the movable stage along the Z linear direction by current flow in electrical conductors provided in the first coil and/or in the second coil.

In this case, the group of magnets may desirably be made up from a first group of magnets which are fitted with their N poles facing towards the other stage, and a second group of magnets which are fitted with their S poles facing towards the other stage, with the magnetic flux being formed between the first group of magnets and the second group of magnets in a direction perpendicular to the Z linear direction.

Or, the above described stage construction may desirably also comprise a measurement means, fitted to the one of the stages or to the other of the stages, which outputs measured values corresponding to the amounts of movement of the movable stage along the Z linear direction, around the a rotational direction, and around the β rotational direction; and a control means which receives the measured values from the measurement means and controls the flow of current in the electrical conductor.

Moreover, desirably, the one of the stages may be the movable stage, with the other of the stages being the fixed stage.

Also, desirably, force may be applied to said movable stage along said Z linear direction due to attractive or repulsive force between said group of magnets and said electrical conductor.

According to the present invention, it is possible to prevent emission of dust from the magnet, since the magnet is sealed within the closed plenum.

In the event that the portion of the fixed stage which is located between the magnet and the magnetic material is made from a material of low magnetic permeability, there is no problem of this portion impeding the magnetic operation between the magnet and the magnetic material.

With the present invention, it is possible to prevent emission of dust from the electromagnet, and of gas from the insulating material of the coil, since the electromagnet is sealed within the closed plenum.

If a coolant medium is supplied to the plenum, then the electromagnet can be cooled effectively.

Further, if the surface of the electromagnet is covered with a material which has a high coefficient of thermal conductivity, then the electromagnet will be physically isolated from the coolant medium and hence will not be damaged by contact therewith, without however any deterioration in cooling effectiveness, since this covering material will conduct heat from the electromagnet to the coolant medium.

If the coolant medium is supplied to a coolant conduit which is provided between the plenum of the fixed stage and the surface which opposes the movable stage, then temperature rise of the fixed stage and of the movable stage is effectively restrained, since the flow of heat from the electromagnet is intercepted by the flow of coolant in the coolant conduit, and therefore it is possible to elevate the accuracy by which the position of the movable stage can be determined.

If, in this case, the coolant conduit is made from a material which has low magnetic permeability, then no problem will arise of this portion impeding the magnetic operation between the magnet and the magnetic material.

According to the present invention, driving force is exerted upon the movable stage along the Z linear direction, and in the α rotational direction and in the β rotational direction, by attractive or repulsive magnetic force which is generated between a first group of magnets provided to one of the movable stage and the fixed stage and a first group of electromagnets provided to the other of the stages. And driving force is exerted upon the movable stage along the X linear direction and the Y linear direction, and in the θ rotational direction, by crosswise current flow in an electrical conductor provided in the other of the stages crosswise to and within magnetic flux which is generated between a second group of magnets provided to the one of the stages and a second group of electromagnets provided to the other of the stages. Accordingly it is possible accurately to position the movable stage, without any danger of the generation of dust. Further, since the movable stage is driven without any use of air, it is possible to utilize this construction under vacuum conditions.

In this case, it is desirable for each electromagnet comprised in the second group of electromagnets to comprise a first coil wound around the Z linear direction and a second coil wound around a direction perpendicular thereto, with the electrical conductor within which the crosswise current flows being comprised in the second coil. This allows force to be exerted upon the movable stage in the X linear direction and the Y linear direction, and in the θ rotational direction.

Also, when a third coil is provided as wound around a direction perpendicular both to the Z linear direction and also to the perpendicular direction, with the electrical conductor within which the crosswise current flows being comprised in the second coil and/or in the third coil, then this allows force to be exerted upon the movable stage in the X linear direction and the Y linear direction, and in the θ rotational direction. Since the three coils are provided as wound about the X linear direction, the Y linear direction, and the Z linear direction, thereby it is possible efficiently to utilize attractive force, repulsive force, and Lorentz force of the electromagnets without any dependence upon the position of the movable stage, and it is possible to reduce the number of permanent magnets provided upon the movable stage. Accordingly the movable stage can be lightened, so that its speed of displacement can be increased.

If a magnet which only generates attractive magnetic force is provided, then for example, it is possible to separate the electromagnets which perform control of rough movement in the Z linear direction from those which perform fine movement in this direction, so that it is possible to anticipate both high speed and also high accuracy for control in the Z linear direction. Further, if the magnet which only generates attractive magnetic force is provided in the vicinity of the center of the movable stage, then the control of movement of the movable stage is more stable.

If this stage construction also comprises a measurement means which measures the attitude of the movable stage and a control means which receives the measured values from the measurement means, selects the electromagnets to be used and controls the flow of electrical current in these selected electromagnets, then the movable stage can be controlled smoothly.

If the above described one of the stages is the movable stage and the other of the stages is the fixed stage, then no lead wires are required to be led to the movable stage, and furthermore the movable stage can be lightened. Also, it is easier to cool the electromagnets.

According to the present invention, magnetic flux is generated by a group of magnets provided to one of the movable stage and the fixed stage, and driving force is exerted upon the movable stage along the Z linear direction by current flow in an electrical conductor provided upon the other of the movable stage and the fixed stage within the magnetic flux. That is to say, when electrical current flows through the conductor which is located within the magnetic flux which is created by the group of magnets, then a force in the Z linear direction is exerted upon the movable stage due to Lorentz force. In this manner, since the group of magnets is provided to one of the movable stage and the fixed stage, and a force in the Z linear direction is exerted upon the movable stage by using the Lorentz force when current flows in the conductor, provided upon the other of the stages, which lies within the magnetic flux which is generated by the group of magnets, thereby it is possible to avoid any mechanical contact between the movable stage and the fixed stage, and accordingly accurate determination of the position of the movable stage can be performed without generating any dust. Further, it is possible to use this method of driving the movable stage in a vacuum environment, since no air is used for suspending the movable stage.

If as is desirable the electrical conductor is a part of a coil which is made by winding its conductor around an axis in a direction which is perpendicular to the Z linear direction, then a force will be exerted upon the movable stage in the Z linear direction due to the Lorentz force, if electrical current is flowed through this coil.

Since with the present invention there are provided a group of magnets provided to one of the movable stage and the fixed stage, a first coil, provided to the other of the movable stage and the fixed stage, which is wound upon a core around an axis in a direction perpendicular to the Z linear direction, and a second coil wound around the core around an axis in a direction perpendicular both to the Z linear direction and to the axis around which the first coil is wound, thereby, when current is flowed through the first coil which is wound upon a core around an axis in a direction perpendicular to the Z linear direction, then a force will be exerted upon the movable stage in the Z linear direction due to the Lorentz force. Further, when electric current is flowed through the second coil which is wound upon the same core as the first coil and around an axis in a direction perpendicular both to the Z linear direction and to the axis around which the first coil is wound, then a force will likewise be exerted upon the movable stage in the Z linear direction due to the Lorentz force.

If a measurement means, fitted to the one of the stages or to the other of the stages, which outputs measured values corresponding to the amounts of movement of the movable stage along the Z linear direction, in the a rotational direction, and in the β rotational direction, and a control means, which receives the measured values from the measurement means and controls the flow of current in the electrical conductor, are provided, then the movement of the movable stage can be smoothly controlled.

And, if as is desirable the one of the stages is the movable stage, with the other of the stages being the fixed stage, then there is no requirement for lead wires to be led to the movable stage. Further, the cooling of the electromagnets is simplified.

DESCRIPTION OF THE PREFERRED EMBODIMENTS

Preferred Embodiment 1

Figure 1:
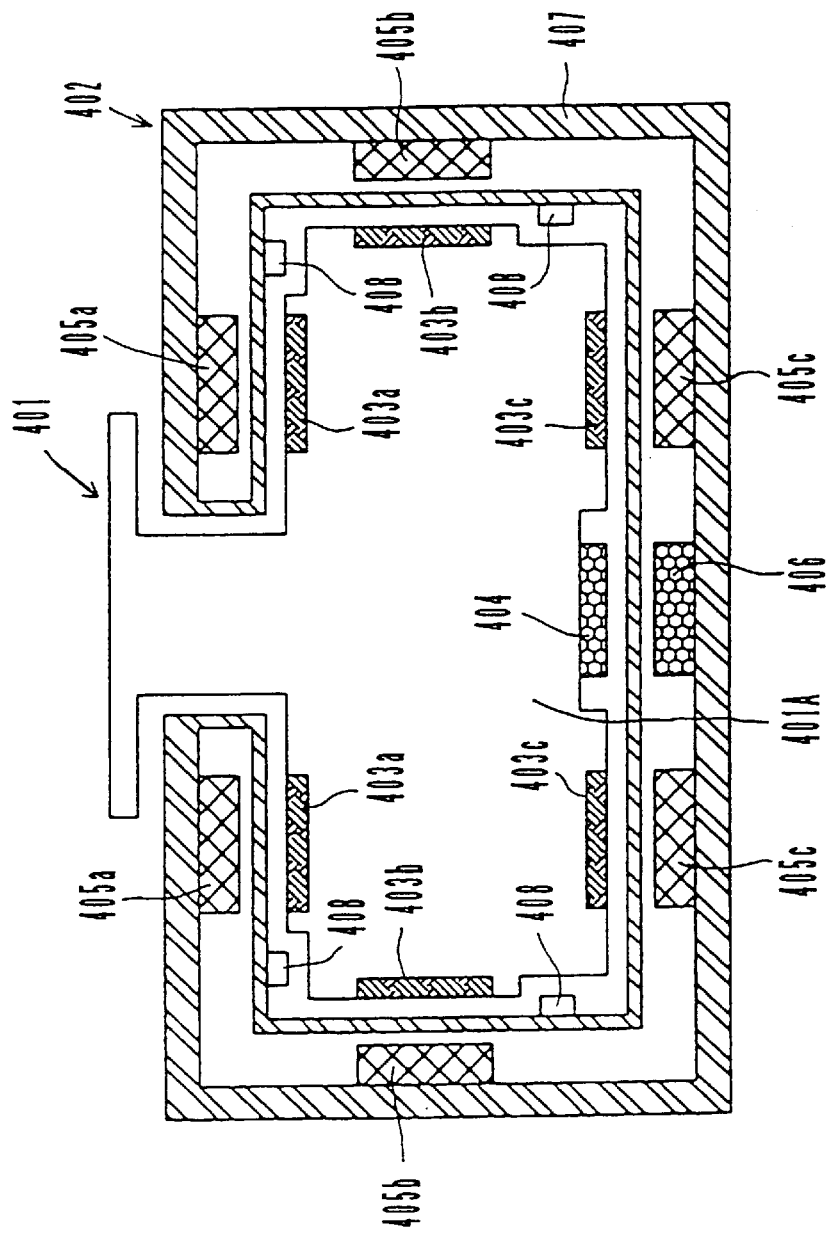
FIG. 1 is a sectional view showing a first preferred embodiment of the stage construction incorporating a magnetically levitated movable stage according to the present invention.

The first preferred embodiment of the stage construction incorporating a magnetically levitated movable stage according to the present invention will now be explained. As shown in FIG. 1, this stage construction according to the first preferred embodiment comprises a movable stage 401 and a fixed stage 402 which is formed so as to surround this movable stage 401. The movable stage 401 includes a drive portion 401A which is contained within the interior of the fixed stage 402, and upper iron plates 403a are fixed to the upper face of the drive portion 401A, side iron plates 403b are fixed to the side faces of the drive portion 401A, and lower iron plates 403c and permanent magnets 404 are fixed to the lower face of the drive portion 401A.

The fixed stage 402 comprises upper electromagnets 405a fixed to its upper portion which oppose the upper iron plates 403a, side electromagnets 405b fixed to its side portions which oppose the side iron plates 403b, lower electromagnets 405c fixed to its bottom portion which oppose the lower iron plates 403c, and permanent magnets 406 which oppose the permanent magnets 404; and these electromagnets 405a, 405b, and 405c and these permanent magnets 406 are contained within a sealed plenum 407 which is formed so as to surround and contain the drive portion 401A of the movable stage 401. Further, gap sensors 408 are provided between the fixed stage 402 and the drive portion 401A, and these sensors 408 may be electrostatic capacitance sensors or the like.

The weight of the magnetically levitated movable stage 401 of this stage construction constructed as described above is compensated for by the repulsive force between the permanent magnets 404 and the permanent magnets 406, and this movable stage 401 is driven by attractive force between the electromagnets 405a, 405b, and 405c and the iron plates 403a, 403b, and 403c. By adjusting the supply of electric current to the electromagnets 405a, 405b, and 405c, this attractive force can be altered, and thereby the movement and rotation of the movable stage 401 can be controlled.

By housing the electromagnets 405a, 405b, and 405c within the sealed plenum 407 in this manner, it is possible to prevent gas evolved from the insulating material or the like with which the coils of these electromagnets 405a, 405b, and 405c are coated from being released into the working space around the movable stage 401, and furthermore it is possible to prevent dust which is generated from these electromagnets 405a, 405b, and 405c from being released into this working space. Accordingly, this stage construction incorporating a magnetically levitated movable stage according to the present invention can be effectively used in a clean room or under vacuum conditions.

Preferred Embodiment 2

Figure 2:
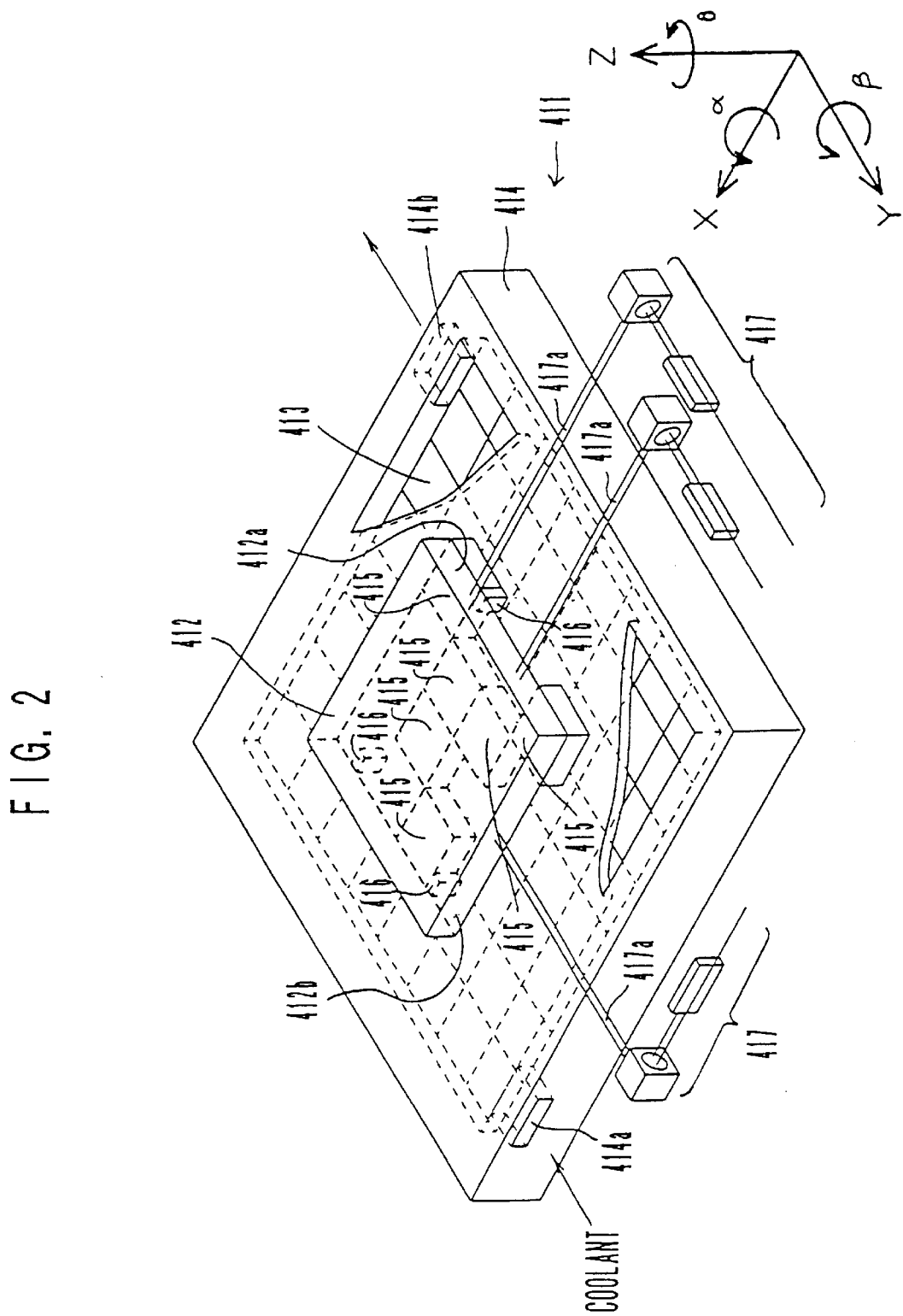
FIG. 2 is a perspective view showing a second preferred embodiment of the stage construction incorporating a magnetically levitated movable stage according to the present invention.
Figure 3:
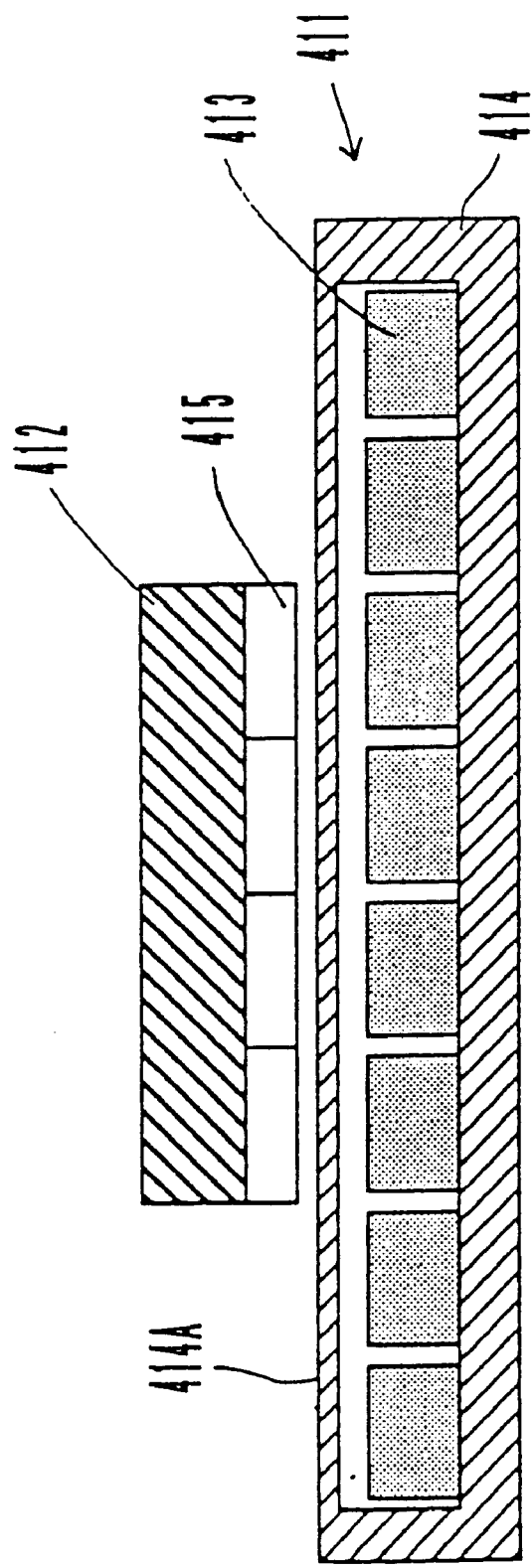
FIG. 3 is a sectional view of this second preferred embodiment shown in FIG. 2.

The second preferred embodiment of the stage construction according to the present invention will now be explained with reference to FIGS. 2 and 3. Moreover, FIG. 2 shows a system of orthogonal coordinate axes X, Y, and Z and respectively corresponding rotational direction α, β, and θ which will be used for describing this second preferred embodiment. As shown in these figures, this stage construction comprises a rectangular fixed stage 411 and a rectangular movable stage 412 which is smaller than the fixed stage 411. The fixed stage 411 comprises a plurality of columns of electromagnets 413, disposed beside one another in the X-axis direction and each extending along the Y-axis direction, and a closed plenum 414 which is formed so as to surround and contain these electromagnets 413, and this closed plenum 414 is provided at its opposite corners with an inlet aperture 414a and an outlet aperture 414b, respectively for supplying cooling water to and exhausting cooling water from the inside of the plenum 414. Further, an upper defining plate 414A of the closed plenum 414 is made from a material which has a low magnetic permeability.

To the bottom surface of the movable stage 412 which is levitated above the upper portion of the fixed stage 411 there are fixed six permanent magnets 415a, 415b, 415c, 415d, 41e, and 415f; and there are also fixed thereto three gap sensors 416 which take the upper surface of the defining plate 414A of the closed plenum 414 as a standard surface and which measure the position of the movable stage 412 along the Z axis and also its angular positions with respect to the a direction and with respect to the β direction. And three laser interferometers 417 are provided around the fixed stage 411, and measure the position of the movable stage 412 along the X and Y axes and also its angular position with respect to the θ direction. Laser beams 417a which are emitted from the laser interferometers 417 are reflected from mirrors fixed to the side surfaces 412a and 412b of the movable stage 412 and return back to the laser interferometers 417.

A control device (not particularly shown in the figures) which receives information from the gap sensors 416 and from the laser interferometers 417 controls the supply of electrical current to the electromagnets 413, and thereby drives the movable stage 412 in any desired manner. By supplying electrical current to the electromagnets 413, it is possible to drive the movable stage 412 using electromagnetic attractive force, repulsive force, Lorentz force, and the like.

Since in this second preferred embodiment of the present invention the electromagnets 413 are housed within the closed plenum 414, it is possible to prevent gas evolved from the insulating material or the like with which the coils of these electromagnets 413 are coated, or dust which is generated from these electromagnets 413, from being released into the working space. Accordingly, this stage construction incorporating a magnetically levitated movable stage according to the second preferred embodiment of the present invention can be effectively used in a clean room or under vacuum conditions. Furthermore, the cooling water which is passed through the closed plenum 414 cools the electromagnets 413 efficiently. And since the upper defining plate 414A is cooled by the cooling water, heating up of the movable stage 412 itself is also prevented. Accordingly, it is possible to prevent deterioration of the accuracy of positioning due to temperature variation, and deterioration of the quality of the electromagnets 413 due to heating up thereof.

Although in the second preferred embodiment shown in FIG. 2 a total of six permanent magnets 415 were provided to the movable stage 412, the number of permanent magnets, and their arrangement, is not to be considered as limited to those utilized in this second preferred embodiment. Further, the construction of the cores of the electromagnets and of their coils, and the material of which they are made, and their arrangement, may all be selected according to particular requirements. By providing a TEFLON layer or the like on the surfaces of the electromagnets, it is possible to avoid long term corrosion damage caused by the cooling water. Furthermore, it is also possible to control the supply of electrical current to the electromagnets by the use of Hall elements. The type of cooling fluid used is not limited to water. The method of control which is performed by the control device may be PD control (proportional differential control), PI control (proportional integral control), PID control (proportional integral and differential control), fuzzy control, robust control, or the like.

Preferred Embodiment 3

Figure 4:
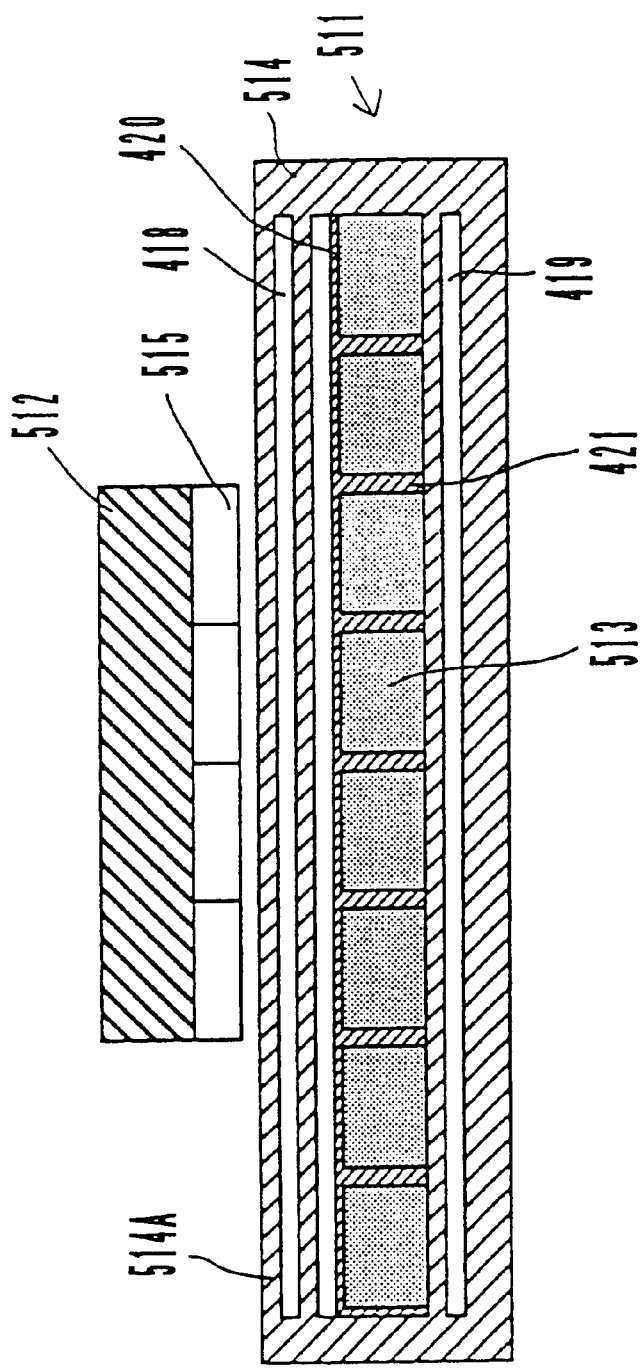
FIG. 4 is a sectional view showing a third preferred embodiment of the stage construction incorporating a magnetically levitated movable stage according to the present invention.

The third preferred embodiment of the present invention will now be explained with reference to FIG. 4; the explanation will principally focus upon the points in which this third preferred embodiment differs from the second preferred embodiment, and elements of this third preferred embodiment which correspond to elements present in the second preferred embodiment will be denoted by the same reference symbols, and description thereof will be curtailed. As shown in FIG. 4, an upper plenum 418 is defined above the electromagnets 513 which are housed in the closed plenum 514 of the fixed stage 511 of this third preferred embodiment, and a lower plenum 419 is defined below the electromagnets 513. Inlet and outlet apertures (not shown in the figure) for cooling water are formed in these plenums 418 and 419, so as to supply a flow of cooling water. Further, the surfaces of the electromagnets 513 are covered with a layer 421 of a resin which has excellent heat conducting properties, i.e. which has a high coefficient of thermal conductivity.

In this third preferred embodiment, by flowing the cooling water through the plenums 418 and 419, it is possible to cool the electromagnets even more efficiently than in the case of the second preferred embodiment described above, and therefore it is possible even more effectively to prevent deterioration thereof due to overheating. Further, since the upper surface 514A of the closed plenum 514 is very well cooled, rise of the temperature of the fixed stage 511 and of the movable stage 512 is very effectively prevented, so that the accuracy of position fixing is enhanced.

Preferred Embodiment 4

Figure 5:
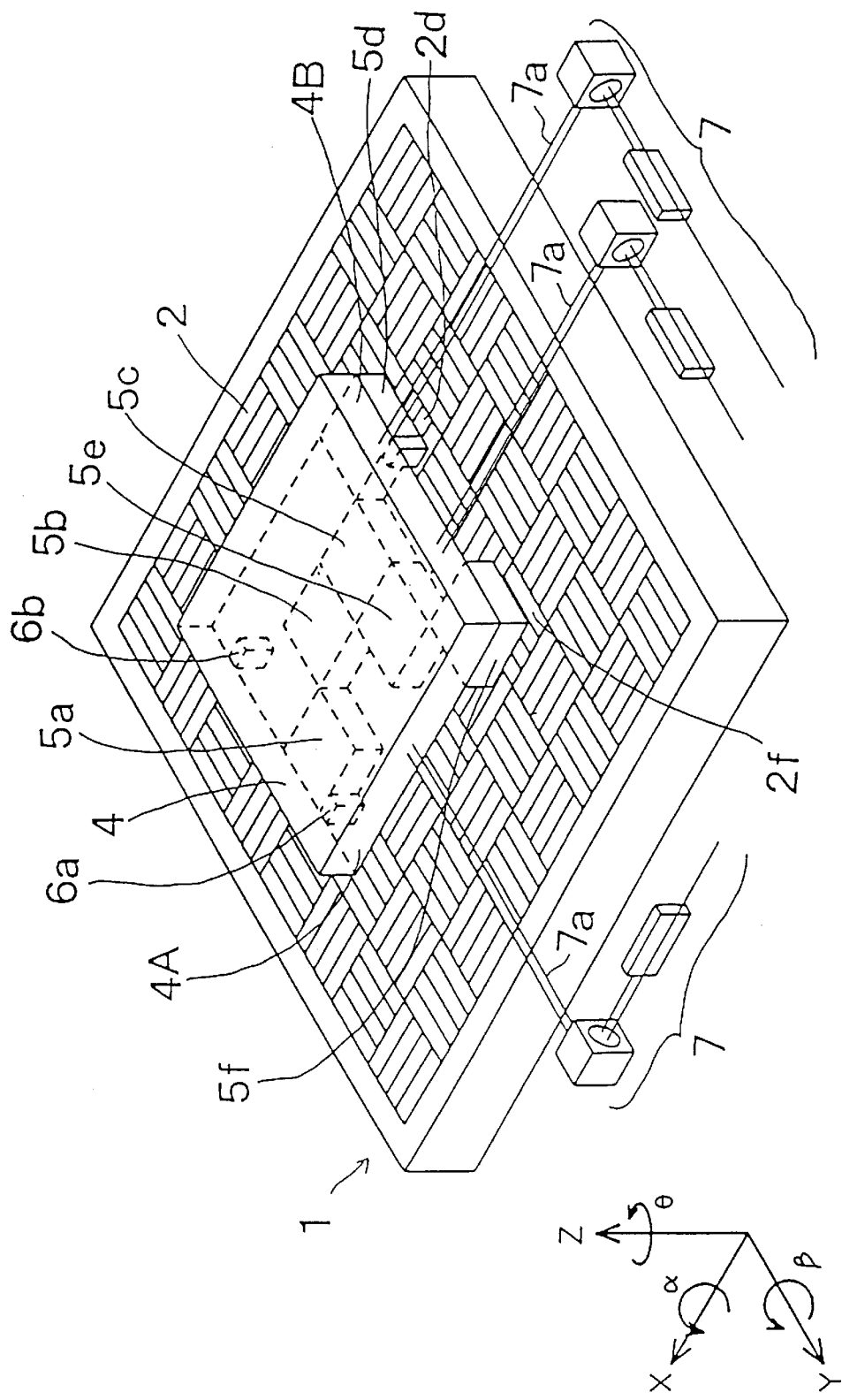
FIG. 5 is a perspective view showing a fourth preferred embodiment of the stage construction incorporating a magnetically levitated movable stage according to the present invention.
Figure 6:
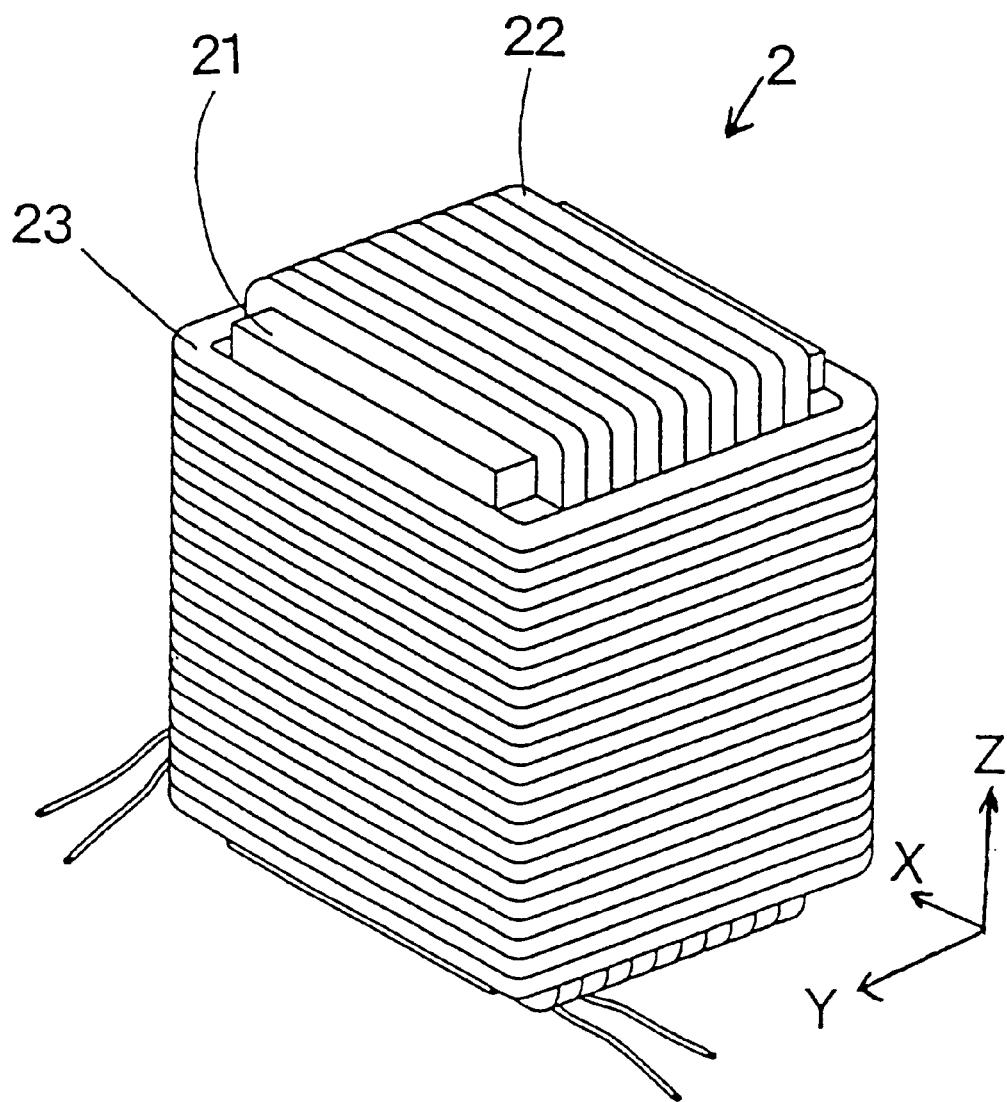
FIG. 6 is a perspective view showing an electromagnet incorporated in this fourth preferred embodiment.
Figure 7:
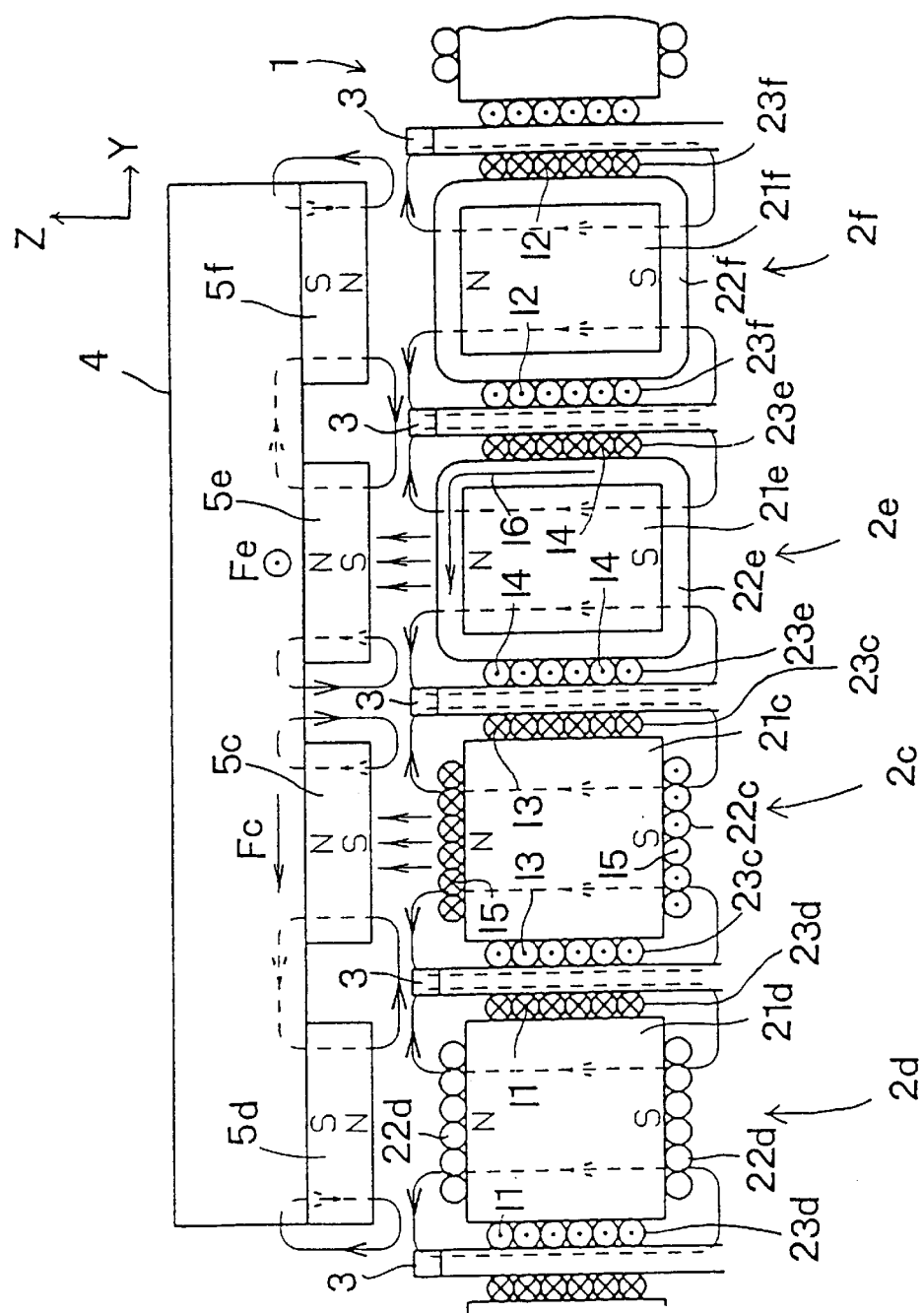
FIG. 7 is a figure showing the principle of operation of this fourth preferred embodiment.

The fourth preferred embodiment of the stage construction incorporating a magnetically levitated movable stage according to the present invention will now be explained with reference to FIGS. 5 through 10. Now, FIG. 5 shows a system of orthogonal coordinate axes X, Y, and Z and respectively corresponding rotational angle to direction α, β, and θ which will be used for describing this second preferred embodiment. Further, as is per se conventional, rotation about the α direction will herein be termed "pitching", rotation about the β direction will herein be termed "rolling", and rotation about the θ direction will herein be termed "yawing". As shown in FIG. 5, a plurality of electromagnets 2 are arranged in rows upon a rectangular fixed stage 1. As shown in FIG. 6, each of these electromagnets 2 comprises a core 21 which is a rectangular parallelepiped, and a coil 22 is initially wound onto this core 21 around a horizontal direction in the figure, and then a coil 23 is wound on top of this coil 22 around the Z-axis direction; so that the axes of the coil 22 and the coil 23 are perpendicular. In FIG. 5, the parallel lines drawn in the square regions which denote the presence of the electromagnets 2 are for schematically showing the directions of the coils 22 of these electromagnets 2. As shown in this figure, the electromagnets 2 are arranged in a two-dimensional matrix with their coils 22 aligned alternately in checkerboard fashion along the X-axis direction and along the Y-axis direction. As shown in FIG. 7, between neighboring ones of the electromagnets 2 there are fitted Hall elements 3 which project higher upwards than the upper surfaces of the coils 22.

Figure 8:
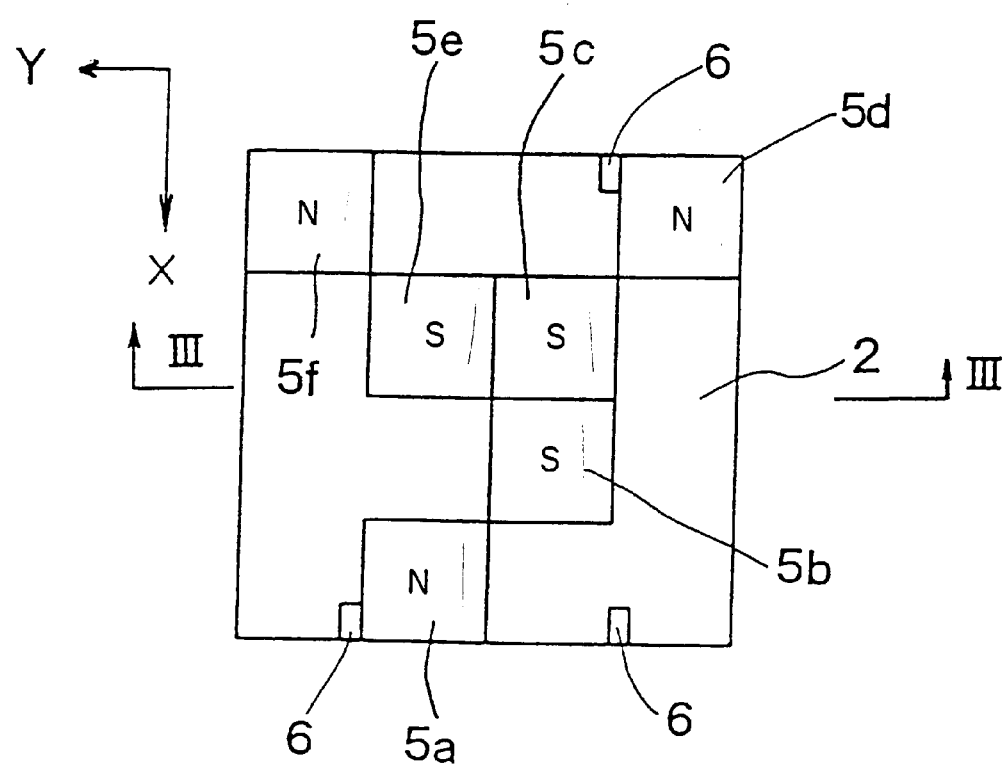
FIG. 8 is a schematic figure showing the under surface of the movable stage of this fourth preferred embodiment.

As shown in FIGS. 5 and 7, a rectangular movable stage 4 which is smaller than the fixed stage 1 is levitated above the fixed stage 1 with a small gap being maintained therebetween. As shown in FIGS. 5 and 8, permanent magnets 5a, 5b, 5c, 5d, 5e, and 5f are provided on the lower surface of the movable stage 4. Three of these permanent magnets— 5a, 5d, and 5f—are fixed with their N poles pointing in the downwards direction in FIG. 5, while the other three permanent magnets—5b, 5c, and 5e—are fixed with their S poles pointing in the downwards direction in FIG. 5. Further, three gap sensors 6 are fitted to the lower surface of the movable stage 4 and measure the magnitude of the gaps between the movable stage 4 and the fixed stage 1 at the positions where they are mounted. The outputs from these three gap sensors 6 serve for determining the position of the movable stage 4 along the Z axis (the vertical axis), and for determining its angular positions with respect to both the pitch direction α and the roll direction β.

As shown in FIG. 5, three laser interferometers 7 are provided around the fixed stage 1. Laser beams 7a which are emitted from the laser interferometers 7 are reflected from mirrors fixed to the side surfaces 4A and 4B of the movable stage 4 and return back to the laser interferometers 7. Thereby these three laser interferometers 7 measure the position of the movable stage 4 along the X and Y axes and also its angular position with respect to the yaw direction θ.

In the following, the principles of operation of this fourth preferred embodiment of the stage construction incorporating a magnetically levitated movable stage according to the present invention constructed as described above will be explained with reference to FIG. 7. The one of the electromagnets 2 which currently is opposing the permanent magnet 5d will be referred to as 2d, the one of the electromagnets 2 which currently is opposing the permanent magnet 5c will be referred to as 2c, the one of the electromagnets 2 which currently is opposing the permanent magnet 5e will be referred to as 2e, and the one of the electromagnets 2 which currently is opposing the permanent magnet 5f will be referred to as 2f. Further, the core and the two coils comprised in the electromagnet 2d will be referred to as 21d, 22d, and 23d respectively; the core and the two coils comprised in the electromagnet 2c will be referred to as 21c, 22c, and 23c respectively; the core and the two coils comprised in the electromagnet 2e will be referred to as 21e, 22e, and 23e respectively; and the core and the two coils comprised in the electromagnet 2f will be referred to as 21f, 22f, and 23f respectively.

Referring to FIG. 7, the electrical current I1 in the coil 23d of the electromagnet 2d flows in the clockwise rotational direction as seen from below. Accordingly the core 21a of the electromagnet 2d is magnetized so that its upper end in the figure is an N pole, and a repulsive force is thereby engendered between this electromagnet 2d and the opposing permanent magnet 5d upon the movable stage 4 (whose downward facing pole, as stated above, is an N pole). Similarly, the electrical current I2 in the coil 23f of the electromagnet 2f also flows in the clockwise rotational direction as seen from below, so that its core 21f is likewise magnetized so that its upper end in the figure is an N pole, and therefore a repulsive force is also engendered between this electromagnet 2f and the opposing permanent magnet 5f (whose downward facing pole is an N pole).

On the other hand, again referring to FIG. 7, the electrical current I3 in the coil 23c of the electromagnet 2c flows in the clockwise rotational direction as seen from below. Accordingly the core 21c of this electromagnet 2c, again, is magnetized so that its upper end in the figure is an N pole, and an attractive force is thereby engendered between this electromagnet 2c and the opposing permanent magnet 5c upon the movable stage 4 (whose downward facing pole, as stated above, is an S pole). Similarly, the electrical current I4 in the coil 23e of the electromagnet 2e also flows in the clockwise rotational direction as seen from below, so that its core 21e is likewise magnetized so that its upper end in the figure is an N pole, and therefore an attractive force is also engendered between this electromagnet 2e and the opposing permanent magnet 5e (whose downward facing pole is an S pole).

Since magnetic repulsive force and magnetic attractive force are generated as described above between the electromagnets 2d, 2c, 2e, and 2f and the permanent magnets 5d, 5c, 5e, and 5f which respectively oppose them, therefore it is possible to control the position of the movable stage 4 along the Z axis (the vertical axis), and also its angular positions with respect to both the pitch direction α and the roll direction β, by controlling the intensities and directions of the electric currents which pass through the respective coils 23d, 23c, 23e, and 23f of the electromagnets 2d, 2c, 2e, and 2f.

As described above, the current I3 flowing in the coil 23c of the electromagnet 2c generates an attractive force between this electromagnet 2c and the opposing permanent magnet 5c. In this state, suppose that a current I5 is also supplied to flow through the coil 22c of this electromagnet 2c in the anticlockwise rotational direction as seen looking in the direction of the Y-axis. Accordingly, in the part of the coil 22c which is higher than its core 21c, this current I5 flows in the direction perpendicular to the surface of the drawing paper and away from the viewer, and due to this current I5 a force in the rightward direction in the figure (a Lorentz force) is experienced in this part of the coil 22c, exerted by the permanent magnet 5c. As a consequence, the movable stage 4 (the permanent magnet 5c thereof) experiences an opposite force, termed "Fc", of equal magnitude in the leftwards direction in the figure, exerted by the fixed stage 1 (the electromagnet 2c thereof). The direction and magnitude of the force Fc experienced by the movable stage 4 can be controlled by varying the magnitude and direction of the current I5 flowing through the coil 22c. Further, it is also possible to control Fc by increasing or decreasing the current I3 which is flowing through the coil 23c, and by thereby varying the attractive force between the electromagnet 2c and the permanent magnet 5c, i.e. by varying the magnetic flux density.

On the other hand, as also described above, the current I4 flowing in the coil 23e of the electromagnet 2e generates an attractive force between this electromagnet 2e and the opposing permanent magnet 5e. In this state, when a current I6 is also supplied to flow through the coil 22e of this electromagnet 2e in the anticlockwise rotational direction as seen in the figure, then according to a principle identical to that described above the movable stage 4 (the permanent magnet 5e thereof) experiences a force, termed "Fe", in the direction perpendicular to the drawing paper and away from the viewer, exerted by the fixed stage 1 (the electromagnet 2e thereof). The direction and magnitude of this force Fe experienced by the movable stage 4 can be controlled by varying the magnitude and direction of the current I6 flowing through the coil 22e and the magnitude of the current I4 flowing through the coil 23e, in the same manner as described above.

Figure 9:
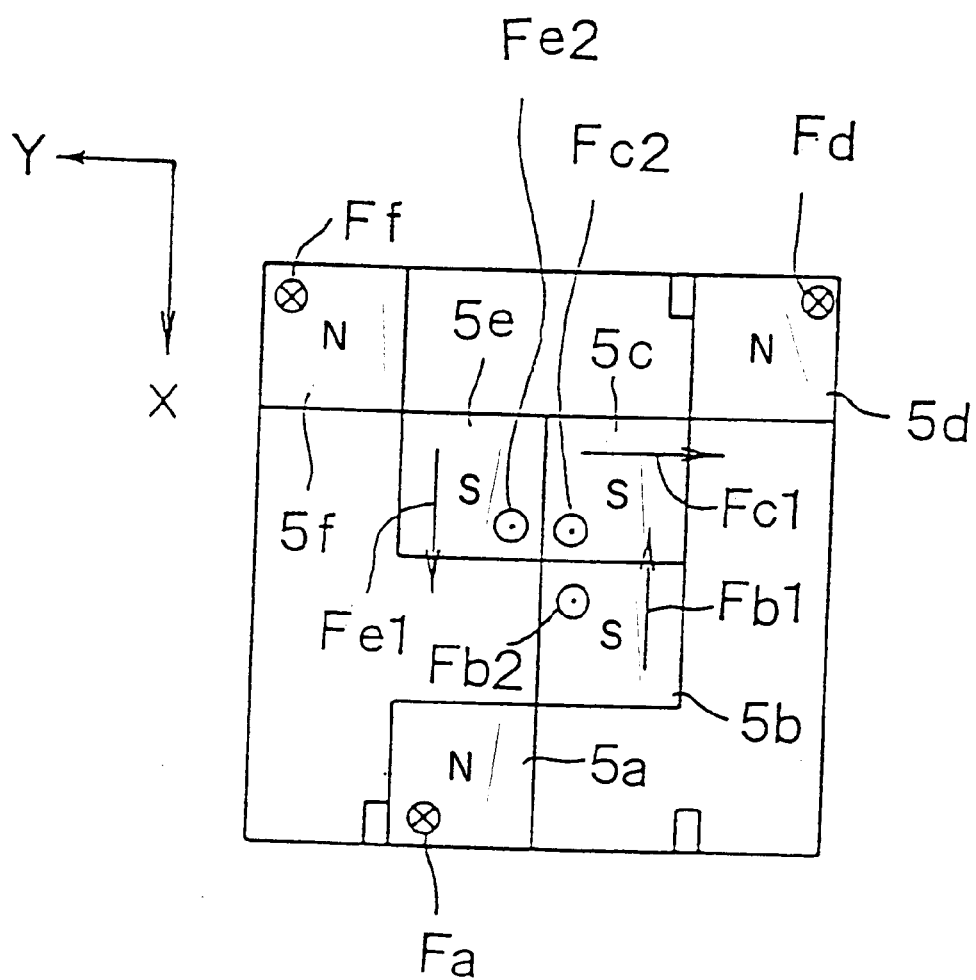
FIG. 9 is a schematic figure particularly showing the forces experienced by the permanent magnets upon the under surface of the movable stage of this fourth preferred embodiment.

FIG. 9 shows the forces which are experienced by the permanent magnets 5a, 5b, 5c, 5d, 5e, and 5f mounted upon the movable stage 4. Each of these permanent magnets 5 experiences a force from its corresponding electromagnet which is mounted upon the fixed stage 1: the permanent magnet 5a from the electromagnet 2a (not shown), the permanent magnet 5b from the electromagnet 2b (not shown), the permanent magnet 5c from the electromagnet 2c, the permanent magnet 5d from the electromagnet 2d, the permanent magnet 5e from the electromagnet 2e, and the permanent magnet 5f from the electromagnet 2f. The permanent magnets 5a, 5d, and 5f respectively experience forces Fa, Fd, and Ff (repulsive forces) in the Z-axis direction, while the permanent magnets 5b, 5c, and 5e respectively experience forces Fb2, Fc2, and Fe2 (attractive forces) in the Z-axis direction. These forces are controlled by the currents which flow through the respective coils 23a, 23b, 23c, 23d, 23e, and 23f of the electromagnets 2a, 2b, 2c, 2d, 2e, and 2f. Further, the permanent magnets 5b, 5c, and 5e also respectively experience a force Fb1 in the X-axis direction, a force Fc1 in the Y-axis direction, and a force Fe1 in the X-axis direction. These forces Fb1, Fc1, and Fe1 are controlled by the currents which flow through the respective coils 22b, 22c, and 22e and coils 23b, 23c, and 23e of the electromagnets 2b, 2c, and 2e.

When from the state shown in FIG. 9 the movable stage 4 is shifted in the X-axis direction or in the Y-axis direction by a distance just equal to the pitch of the electromagnets 2, then the directions of the coils 22 of those of the electromagnets 2 which now oppose the permanent magnets 5b, 5c and 5e are rotated through 90<deg> from the corresponding directions before the shift. Accordingly, the directions of the forces experienced by the permanent magnets 5b, 5c and 5e are also rotated through 90<deg>.

Figure 10:
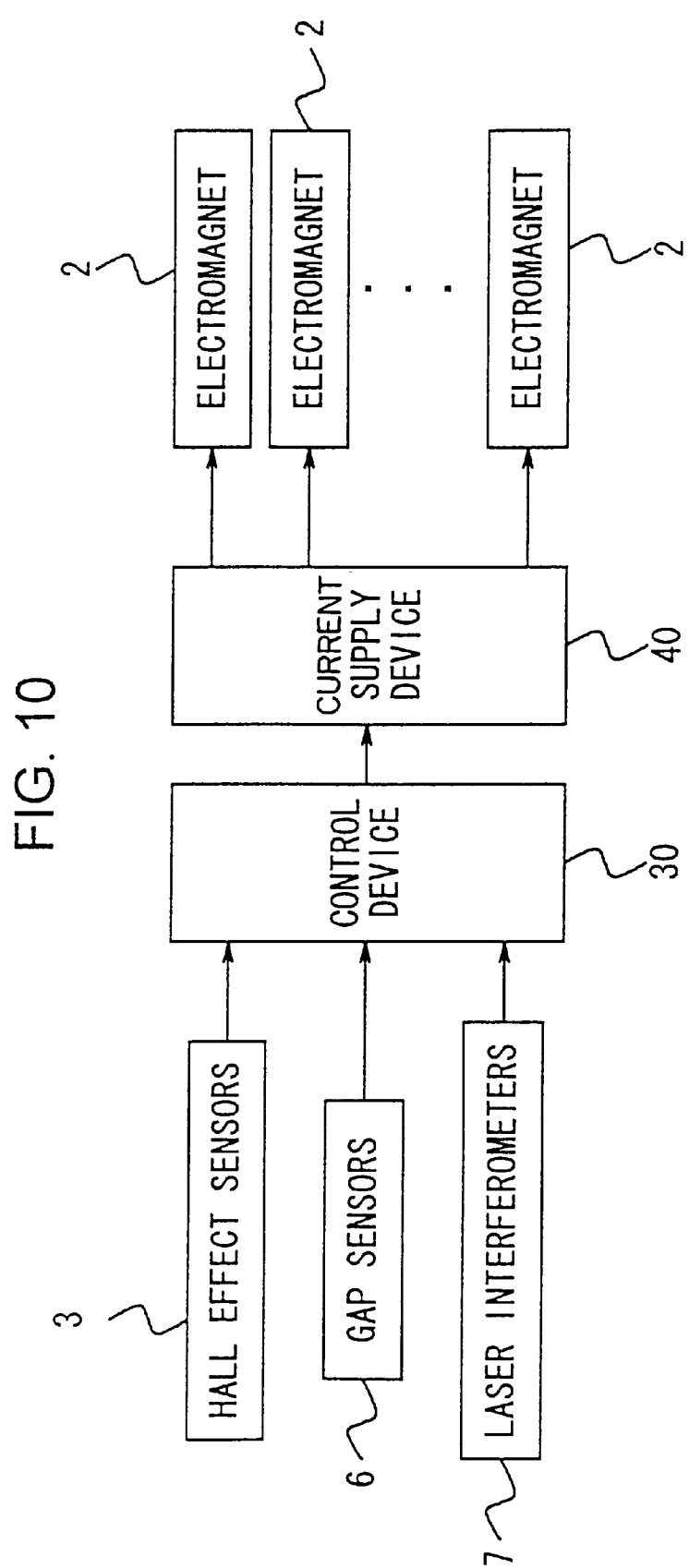
FIG. 10 is a block diagram of a control system for controlling the movement of the movable stage of this fourth preferred embodiment.

As shown in FIG. 10, a control device 30 receives information from the Hall effect sensors 3, the gap sensors 6, and the laser interferometers 7, and controls a current supply device 40 so as to supply electric currents to the various coils of the electromagnets 2, as appropriate. Here, the Hall effect sensors 3 detect the magnetic fields of the permanent magnets 5a, 5b, 5c, 5d, 5e, and 5f of the movable stage 4 and calculate the positions and magnetic polarities of these permanent magnets 5, and the control device 30 receives this information and determines the magnitudes and directions for the electrical currents which are to be supplied to the coils of the electromagnets 2. Accordingly, without any dependence upon the current position of the movable stage 4, appropriate electrical currents can always be supplied to those of the electromagnets 2 which are opposite to some of the permanent magnets 5, so that the movable stage 4 can be appropriately controlled. Further, the gap sensors 6 measure the gaps between the movable stage 4 and the fixed stage 1, and the control device 30 receives this information and controls the magnitudes of the electrical currents appropriately based thereupon. By doing this, the amount of displacement of the movable stage 4 in the Z-axis direction and its rotational positions with respect to both the pitch direction α and the roll direction β are controlled. Further, the three laser interferometers 7 measure the amount of displacement of the movable stage 4 in the X-axis direction and in the Y-axis direction and its rotational position with respect to the yaw direction θ, and the control device 30 receives this information and determines which of the coils should be supplied with electrical current, and the magnitudes and directions of the electrical currents to be supplied thereto. By doing this, the amount of displacement of the movable stage 4 in the X-axis direction and in the Y-axis direction, and its rotational position with respect to the yaw direction θ are controlled. The method of control which is performed by the control device 30 may be PD control (proportional differential control), PI control (proportional integral control), PID control (proportional integral and differential control), fuzzy control, robust control, or the like.

Although according to the above described construction the amount of displacement of the movable stage 4 along the Z-axis direction and the angular position thereof with respect to both the pitch direction α and the roll direction β were measured using three gap sensors 6, it would also be acceptable, as an alternative, to use four or more such gap sensors 6, in order to enhance the accuracy of measurement. It would also be acceptable to utilize capacitance sensors, eddy-current sensors, laser interferometer sensors, or the like as the gap sensors 6, and these may be used independently or alternatively in groups of two or more. Further, although in this fourth preferred embodiment the gap sensors 6 were fixed to the movable stage 4, it would also be acceptable, as an alternative, to fix the gap sensors to the fixed stage 1. It is also possible to provide plates of high magnetic permeability and of a desirable planarity upon the upper surface of the fixed stage 1, or upon the lower surface of the movable stage 4 (the surface opposing the gap sensors), in order more accurately to measure the gap between the fixed stage 1 and the movable stage 4.

Although in this fourth preferred embodiment the amounts of displacement of the movable stage 4 along the X-axis direction and along the Y-axis direction and the angular position thereof with respect to the yaw direction θ were measured using the laser interferometers 7, it would also be possible to utilize capacitance sensors, eddy-current sensors, or the like instead of these laser interferometers 7. Further, although in this fourth preferred embodiment three of these laser interferometers 7 were used, it would also be acceptable, as an alternative, to use four or more such laser interferometers 7 as the sensors, in order to enhance the accuracy of measurement.

In this fourth preferred embodiment of the present invention, the electromagnets to which electric current was to be supplied were selected, and the directions of the electric currents to be supplied were determined upon, by detecting the magnetic fields of the permanent magnets 5 fitted to the movable stage 4 using the Hall effect sensors 3 fitted to the fixed stage 1, but this is not fundamental to the concept of the present invention; it would-also be possible to omit the Hall effect sensors 3, and instead to select the electromagnets to which electric current is to be supplied and the directions of the electric currents to be supplied, based upon the amount of displacement of the movable stage 4 along the X-axis direction and along the Y-axis direction and upon the angular position thereof with respect to the yaw direction θ, as measured using the laser interferometers 7.

The disposition of the permanent magnets 5 upon the movable stage 4 is not to be considered as limited to the particular one disclosed in this fourth preferred embodiment. Further, although in the shown preferred embodiment neighboring coils 22 of the electromagnets 2 were oriented alternately in mutually perpendicular directions, this arrangement is not intended to be limitative of the present invention, and it would be acceptable for the arrangement of the permanent magnets 5 upon the movable stage 4 to be suitably selected to correspond to the arrangement of the electromagnets 2 upon the fixed stage 1. Moreover, the number of windings upon the coils 22 and 23 and the density of the windings thereof and so on may be selected as desirable and appropriate. Furthermore, it would also be acceptable to provide special electromagnets for capturing or shielding leaking magnetic flux which is generated by the electromagnets 2 or by the permanent magnets 5. Or, alternatively, it would be possible to provide the permanent magnets upon the fixed stage and the electromagnets upon the movable stage, or both stages could be provided with electromagnets; but by providing permanent magnets upon the movable stage, as in this fourth preferred embodiment, the beneficial effect is obtained that no lead wires for electromagnets need to be provided to the movable stage, which is advantageous with regard to further lightening of the movable stage.

Although the above explanation has been made only in terms of the permanent magnets and the electromagnets being directly opposed to one another, if on the other hand they are not thus directly mutually opposed, it is also possible to supply electric current to a single electromagnet, or to a plurality of electromagnets, adjacent to each of the permanent magnets. Further, although in this fourth preferred embodiment it was arranged that electric current was only supplied to those of the electromagnets which currently opposed the permanent magnets, it would also be acceptable to utilize others of the electromagnets which were within the range currently reached by the magnetic flux of the permanent magnets, for exerting force upon the movable stage.

Although in the above described fourth preferred embodiment permanent magnets 5b, 5c, and 5e were used, it would also be possible, as an alternative, to utilize elements made from a magnetic material. In this case, it would be possible to control the amount of movement of the movable stage 4 in the X-axis direction and in the Y-axis direction, and the amount of angular displacement thereof with respect to the yaw direction θ, by supplying current to flow in the coils 22b, 22c, and 22e in appropriate intensities and directions in the state in which the magnetic material elements were magnetized by electric current flowing through the coils 23b, 23c, and 23e (so that attractive forces were generated).

Although the description of the above described fourth preferred embodiment was made in terms of a movable stage which was levitated and driven above a fixed stage, it would also be possible to levitate the movable stage below the fixed stage, by utilizing attractive magnetic force between them.

Preferred Embodiment 5

Figure 11:
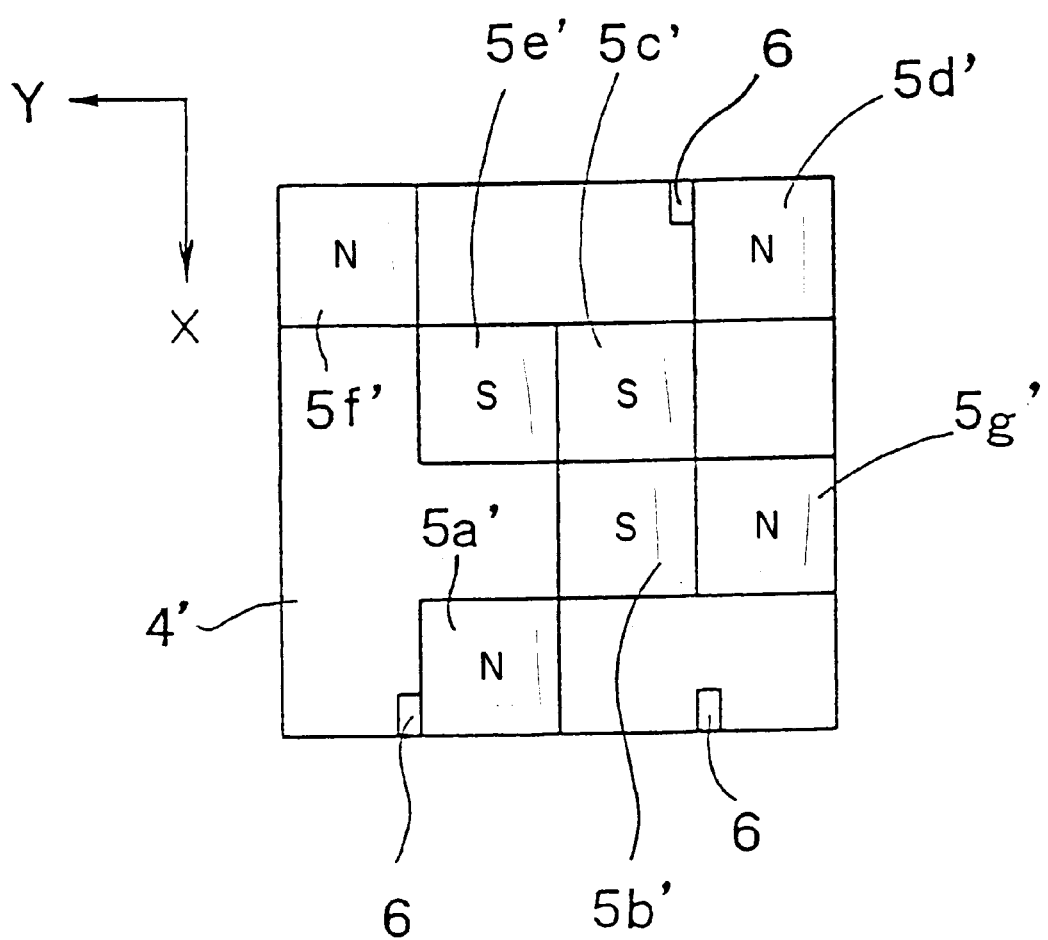
FIG. 11 is a schematic figure, similar to FIG. 8 for the fourth preferred embodiment, showing the under surface of the movable stage of a fifth preferred embodiment of the stage construction incorporating a magnetically levitated movable stage according to the present invention.

The fifth preferred embodiment of the stage construction incorporating a magnetically levitated movable stage according to the present invention will now be explained with reference to FIGS. 11 and 12. The description of this fifth preferred embodiment will chiefly focus upon the points in which it differs from the fourth preferred embodiment described above; elements of this fifth preferred embodiment which correspond to elements present in the fourth preferred embodiment described above will be denoted by the same reference symbols, and description thereof will be curtailed. As shown in FIG. 11, permanent magnets 5a', 5b', 5c', 5d', 5e', 5f, and 5g' are fixed to the movable stage 4' of this fifth preferred embodiment. Of these, the permanent magnets 5a', 5d', 5f', and 5g' are oriented with their N poles pointing downwards (towards the fixed stage 1'), while the permanent magnets 5b', 5c', and 5e' are oriented with their S poles pointing downwards.

An electromagnet 2a (not shown in the figures) opposes the permanent magnet 5a', an electromagnet 2b (not shown in the figures) opposes the permanent magnet 5b', an electromagnet 2c opposes the permanent magnet 5c', an electromagnet 2d opposes the permanent magnet 5d', an electromagnet 2e opposes the permanent magnet 5e', an electromagnet 2f opposes the permanent magnet 5f', and an electromagnet 2g opposes the permanent magnet 5g'. For the electromagnet 2a, electrical power is supplied only to its coil 23a; for the electromagnet 2d, electrical power is supplied only to its coil 23d; for the electromagnet 2e, electrical power is supplied only to its coil 23e; and, for the electromagnet 2f, electrical power is supplied only to its coil 23f. Further, for the electromagnet 2b, electrical power is supplied to its coils 22b and 23b; for the electromagnet 2c, electrical power is supplied to its coils 22c and 23c; and for the electromagnet 2g, electrical power is supplied to its coils 22g and 23g.

Figure 12:
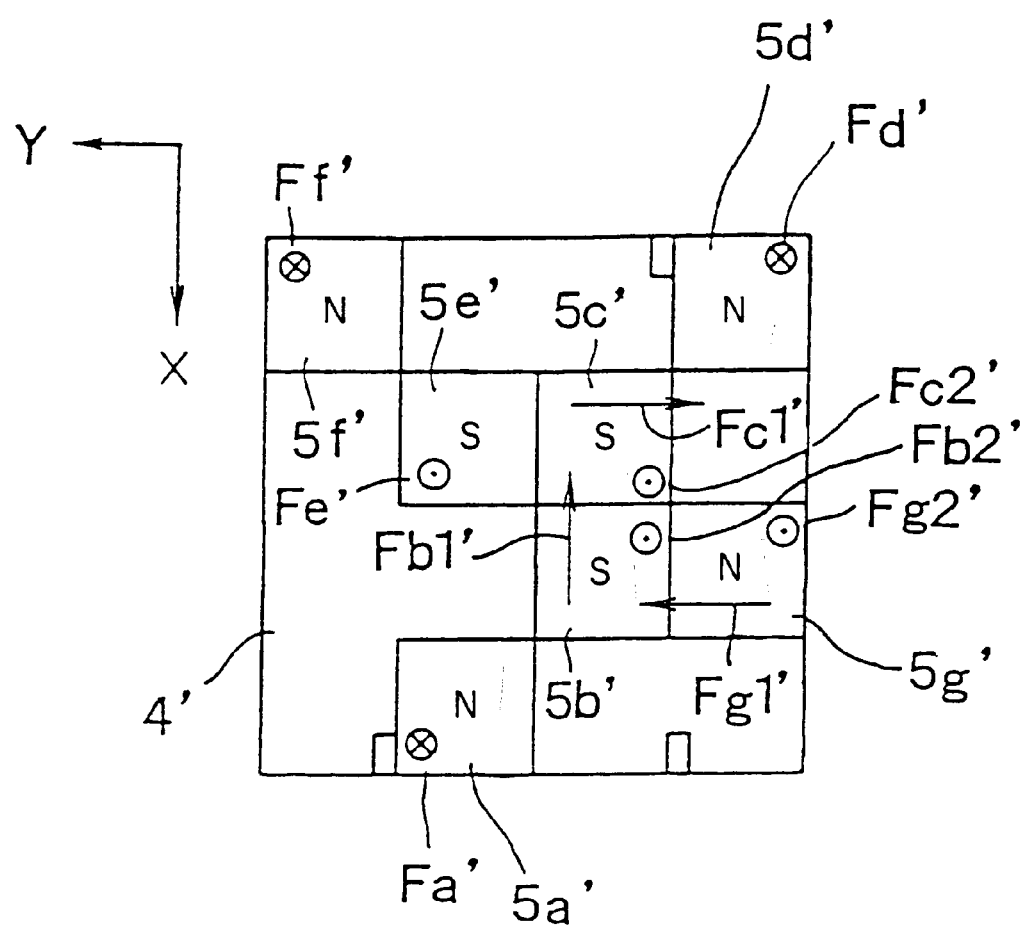
FIG. 12 is a schematic figure, similar to FIG. 9 for the fourth preferred embodiment, particularly showing the forces experienced by the permanent magnets upon the under surface of the movable stage of this fifth preferred embodiment.

FIG. 12 shows the forces which the permanent magnets 5a', 5b', 5c', 5d', 5e', 5f', and 5g' experience. The permanent magnet 5a' experiences a repulsive force Fa' in the Z-axis direction; the permanent magnet 5d' experiences a repulsive force Fd' in the Z-axis direction; and the permanent magnet 5f' experiences a repulsive force Ff' in the Z-axis direction. Further, the permanent magnet 5b' experiences a force Fb1' in the X-axis direction and also a attractive force Fb2' in the Z-axis direction; the permanent magnet 5c, experiences a force Fc1' in the Y-axis direction and also a attractive force Fc2' in the Z-axis direction; the permanent magnet 5g, experiences a force Fg1' in the Y-axis direction and also a attractive force Fg2' in the Z-axis direction. Further, the permanent magnet 5e' experiences a attractive force Fe, in the Z-axis direction. In this manner, in this fifth preferred embodiment, a permanent magnet 5e is provided which only experiences an attractive force Fe'. By contrast, in the fourth preferred embodiment described above, the construction was such that all of the permanent magnets which experienced attractive magnetic forces also experienced Lorentz forces in the horizontal plane.

By adding in this manner a permanent magnet which only generates attractive magnetic force, the controllability of the movable stage 4' along the Z-axis direction can be made even more excellent. For example, if a permanent magnet (in the shown fifth preferred embodiment described above, the permanent magnet 5e') which only generates attractive magnetic force is used only for control of coarse movement along the Z-axis direction, then the permanent magnets 5a', 5d', and 5f' can be used for fine Z-axis movement control, and it is possible to maintain high accuracy of position determination without sacrificing any speed of the movement of the movable stage 4'. Further, by arranging the permanent magnets 5a', 5d', and 5f' by which repulsive magnetic force is generated towards the outside, and by disposing the permanent magnet 5e' which only generates attractive magnetic force in the vicinity of the center of the movable stage 4', it is ensured that the attitude of the movable stage 4 can be easily and stably controlled.

Although the explanation of this fifth preferred embodiment was made with reference to the case in which a permanent magnet was used as the magnet which generated attractive magnetic force only, this is not to be considered as limitative of the present invention: instead of a permanent magnet, it would also be possible to utilize a material (a magnetic material) which was attracted by its opposing electromagnet.

Preferred Embodiment 6

Figure 13:
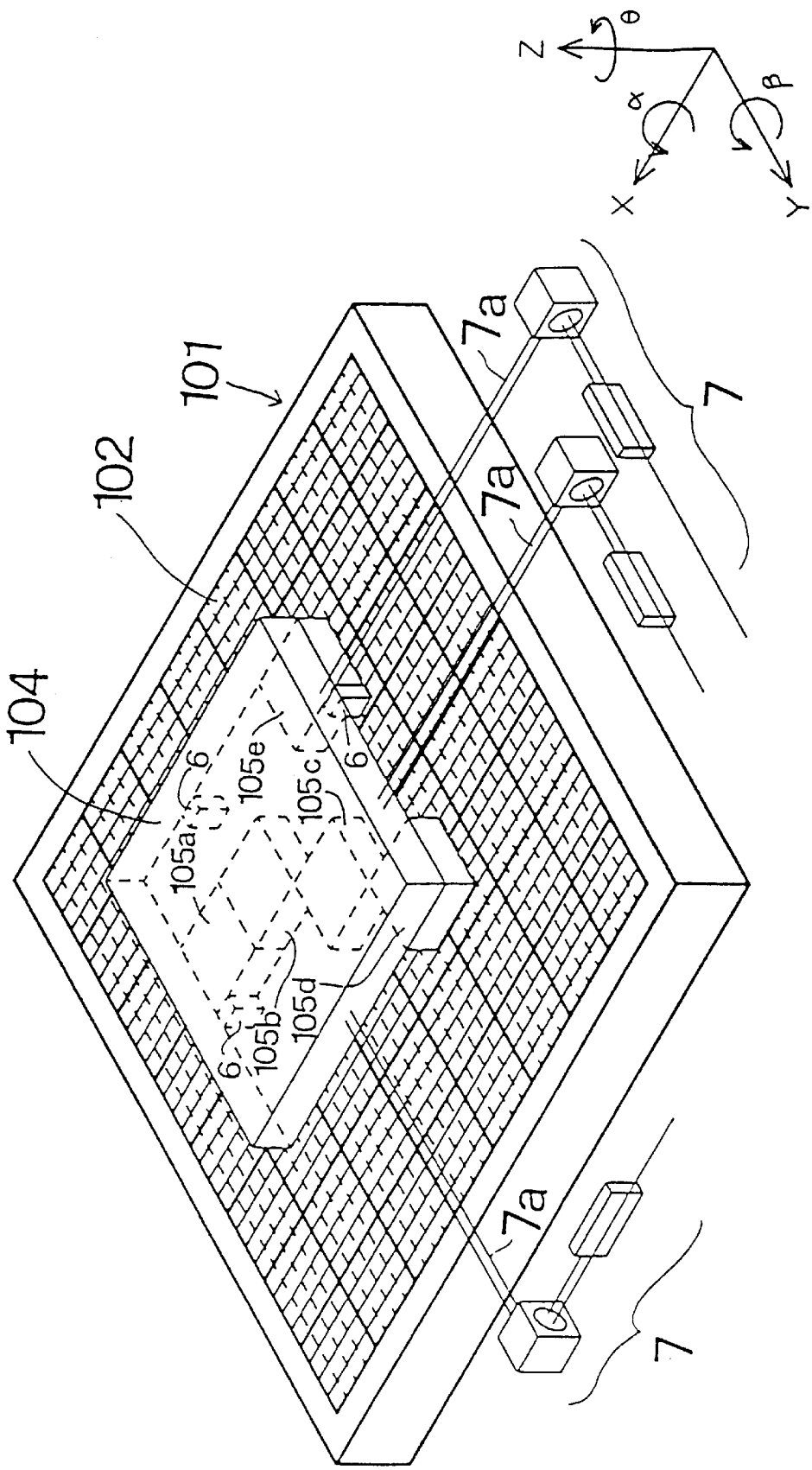
FIG. 13 is a perspective view, similar to FIG. 5 for the fourth preferred embodiment, showing a sixth preferred embodiment of the stage construction incorporating a magnetically levitated movable stage according to the present invention.
Figure 14:
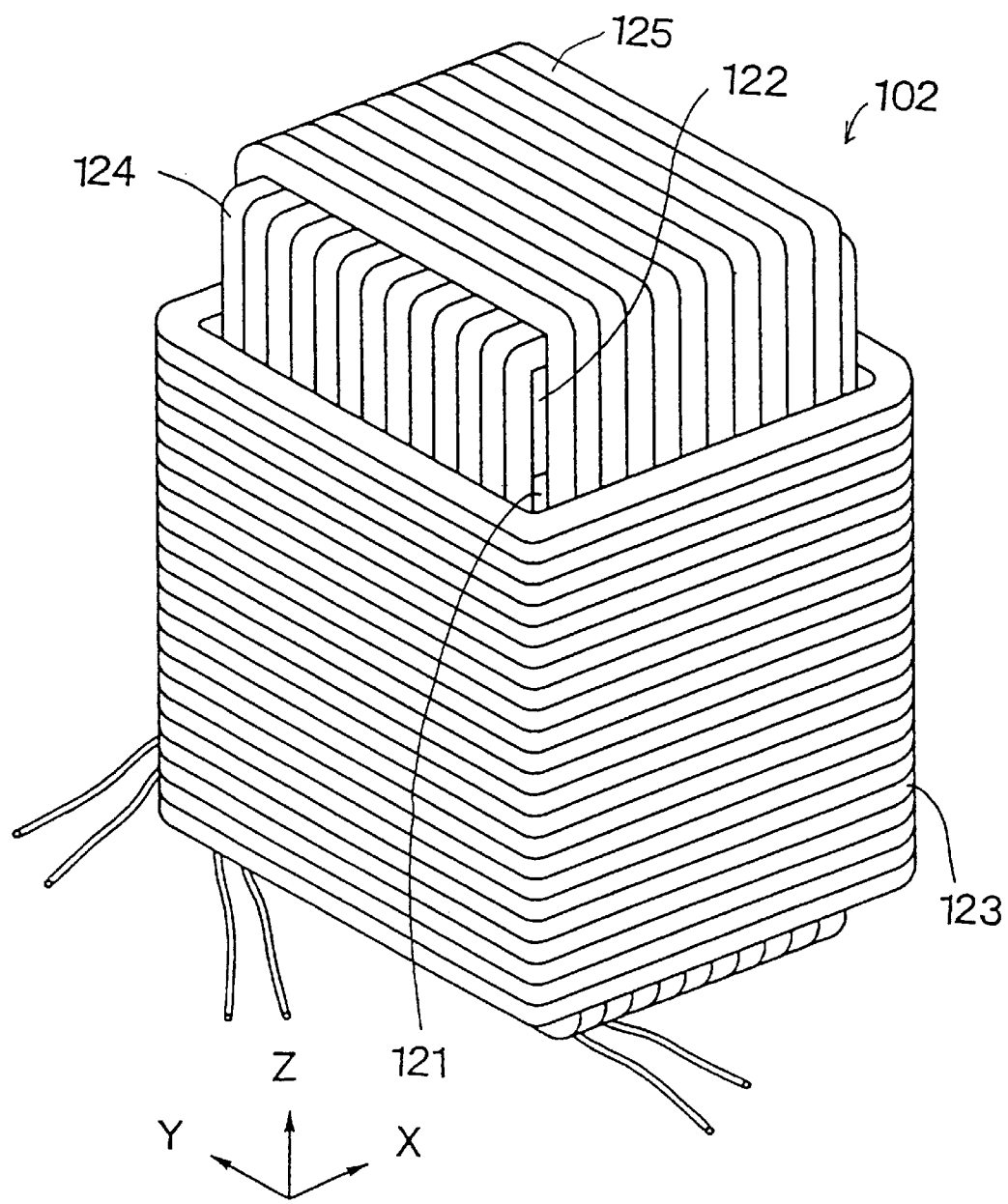
FIG. 14 is a perspective view, similar to FIG. 6 for the fourth preferred embodiment, showing an electromagnet incorporated in this sixth preferred embodiment.
Figure 16:
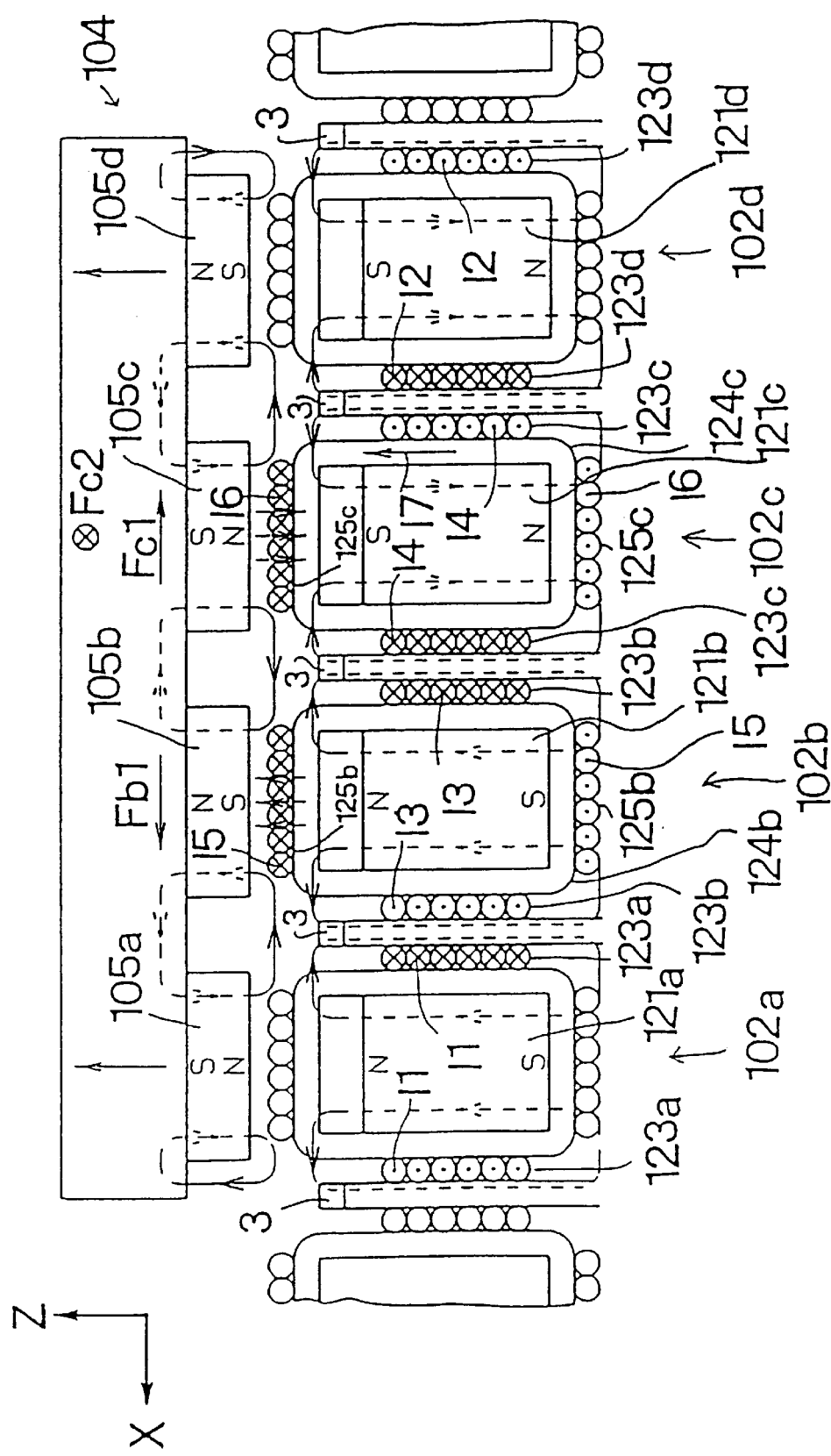
FIG. 16 is a figure, similar to FIG. 7 for the fourth preferred embodiment, showing the principle of operation of this sixth preferred embodiment.

The sixth preferred embodiment of the stage construction incorporating a magnetically levitated movable stage will now be explained. The description of this sixth preferred embodiment will chiefly focus upon the points in which it differs from the fourth preferred embodiment described above; elements of this sixth preferred embodiment which correspond to elements present in the fourth preferred embodiment described above will be denoted by the same reference symbols, and description thereof will be curtailed. As shown in FIG. 13, a plurality of electromagnets 102 are arranged in rows in a fixed stage 101. As shown in FIG. 14, each of these electromagnets 102 comprises a core 121 which is a rectangular parallelepiped, and first a member 122 which has high magnetic permeability is put over this core 121, next a coil 124 is wound onto this core 121 around the Y-axis direction, then a coil 125 is wound on top of this coil 124 around the X-axis direction, and finally a coil 123 is wound on top of this coil 125 around the Z-axis direction; so that the axes of the coil 124, the coil 125, and the coil 123 are all mutually perpendicular. As shown in FIG. 16, Hall elements 3 are fitted between neighboring ones of the electromagnets 102.

Figure 15:
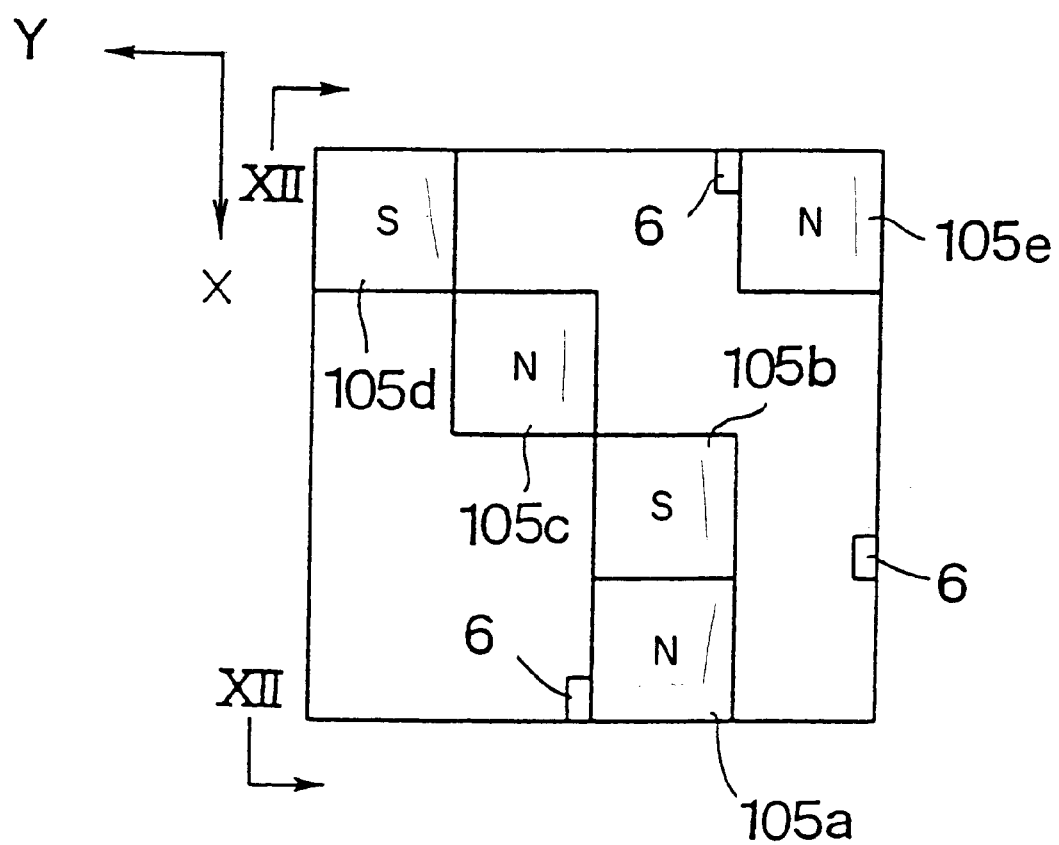
FIG. 15 is a schematic figure, similar to FIG. 8 for the fourth preferred embodiment, showing the under surface of the movable stage of this sixth preferred embodiment.

As shown in FIGS. 13 and 15, permanent magnets 105a, 105b, 105c, 105d, and 105e are provided on the lower surface of the movable stage 104. Three of these permanent magnets—105a, 105c, and 105e—are fixed with their N poles pointing in the downwards direction, while the other two permanent magnets—105b and 105d—are fixed with their S poles pointing in the downwards direction.

In the following, the principles of operation of this sixth preferred embodiment of the stage construction incorporating a magnetically levitated movable stage according to the present invention constructed as described above will be explained with reference to FIG. 16. The one of the electromagnets 102 which currently is opposing the permanent magnet 105a will be referred to as 102a, the one of the electromagnets 102 which currently is opposing the permanent magnet 105b will be referred to as 102b, the one of the electromagnets 102 which currently is opposing the permanent magnet 105c will be referred to as 102c, and the one of the electromagnets 102 which currently is opposing the permanent magnet 105d will be referred to as 102d. Referring to FIG. 16, the electrical current I1 in the coil 123a of the electromagnet 102a flows in the clockwise rotational direction as seen from below. Accordingly the core 121a of this electromagnet 102a is magnetized so that its upper end in the figure is an N pole, and a repulsive force is thereby engendered between this electromagnet 102a and the opposing permanent magnet 105a upon the movable stage 104 (whose downward facing pole, as stated above, is an N pole). On the other hand, the electrical current I2 in the coil 123d of the electromagnet 102d flows in the anticlockwise rotational direction as seen from below, so that its core 121a is magnetized so that its upper end in the figure is an S pole, and therefore a repulsive force is also engendered between this electromagnet 102d and the opposing permanent magnet 105d (whose downward facing pole is an S pole).

On the other hand, again referring to FIG. 16, the electrical current I3 in the coil 123b of the electromagnet 102b flows in the clockwise rotational direction as seen from below. Accordingly the core 121b of this electromagnet 102b is magnetized so that its upper end in the figure is an N pole, and an attractive force is thereby engendered between this electromagnet 102b and the opposing permanent magnet 105b upon the movable stage 104 (whose downward facing pole, as stated above, is an S pole). On the other hand, the electrical current I4 in the coil 123c of the electromagnet 102c flows in the anticlockwise rotational direction as seen from below, so that its core 121c is magnetized so that its upper end in the figure is an S pole, and therefore an attractive force is also engendered between this electromagnet 102c and the opposing permanent magnet 105c (whose downward facing pole is an N pole).

As described above, the current I3 flowing in the coil 123b of the electromagnet 102b generates an attractive force between this electromagnet 102b and the opposing permanent magnet 105b. In this state, suppose that a current I5 is also supplied to flow through the coil 125b of this electromagnet 102b in the clockwise rotational direction as seen looking in the direction of the X-axis. Then, just as has been explained above with reference to the fourth preferred embodiment, the movable stage 104 will experience a Lorentz force, denoted as Fb1, in the leftwards direction in the figure (along the X-axis).

On the other hand, as also described above, the current I4 flowing in the coil 123c of the electromagnet 102c generates an attractive force between this electromagnet 102c and the opposing permanent magnet 105c In this state, when a current I6 is also supplied to flow through the coil 125c of this electromagnet 102c in the clockwise rotational direction as seen in the direction of the X-axis, then according to a principle identical to that described above the movable stage 104 (the permanent magnet 105c thereof) experiences a force, termed "Fc1", in the direction opposite to that of the X-axis. Further, when a current I7 is also supplied to flow through the coil 124c of this electromagnet 102c in the anticlockwise rotational direction as seen in the figure, then the movable stage 104 (the permanent magnet 105c thereof) experiences a force, termed "Fc2", in the direction perpendicular to the drawing paper and away from the viewer.

Figure 17:
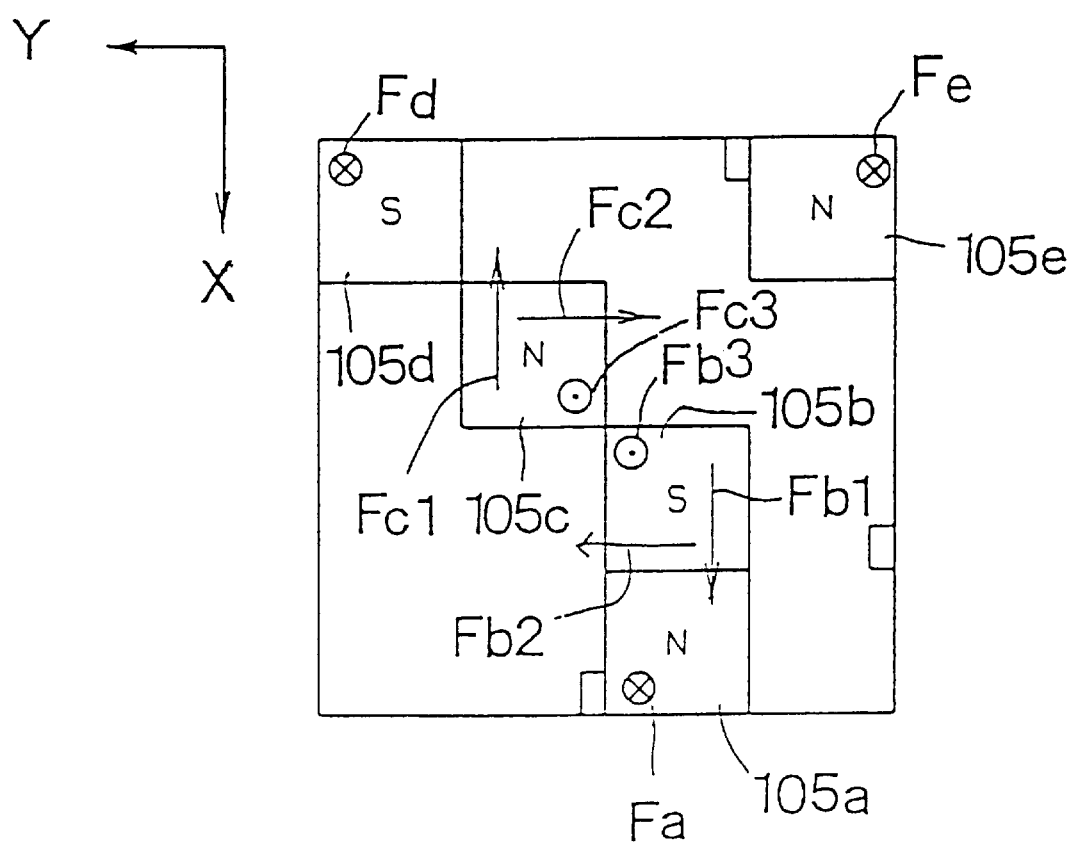
FIG. 17 is a schematic figure, similar to FIG. 9 for the fourth preferred embodiment, particularly showing the forces experienced by the permanent magnets upon the under surface of the movable stage of this sixth preferred embodiment.

FIG. 17 shows the forces which are experienced by the permanent magnets 105a, 105b, 105c, 105d, and 105e mounted upon the movable stage 104 due to their corresponding electromagnets mounted upon the fixed stage 101. Now, the permanent magnets 105e is opposing the electromagnet 102e (not shown). The permanent magnets 105a, 105d, and 105e respectively experience forces Fa, Fd, and Fe (repulsive forces) in the Z-axis direction, while the permanent magnets 105b and 105c respectively experience forces Fb3 and Fc3 (attractive forces) in the Z-axis direction. Further, the permanent magnet 105b also experiences a force Fb1 in the X-axis direction due to the current which flows in the coil 125b of the electromagnet 102b, and a force Fb2 in the Y-axis direction due to the current which flows in the coil 124b thereof. And the permanent magnet 105c also experiences a force Fc1 in the X-axis direction due to the current which flows in the coil 125c of the electromagnet 102c, and a force Fc2 in the Y-axis direction due to the current which flows in the coil 124c thereof. Since each of the electromagnets 102 is equipped in this manner both with a coil 124 and also with a coil 125, it is possible to exert both a force in the X-axis direction and also a force in the Y-axis direction upon one and the same corresponding permanent magnet 105 simultaneously. Further, even when due to motion of the movable stage 104 the electromagnets 102 which currently oppose the permanent magnets 105b and 105c change over, the directions of the forces which can be exerted upon the permanent magnets 105b and 105c are not thereby limited.

In this sixth preferred embodiment of the present invention, each of the electromagnets 102 is equipped with three coils wound so as to be aligned respectively in the X-axis direction, the Y-axis direction, and the Z-axis direction. Due to this, attractive magnetic force, repulsive magnetic force, and Lorentz force all can be effectively utilized without any dependence upon the current position of the movable stage 104, and furthermore it is possible to reduce the number of permanent magnets which are mounted upon the movable stage 104 below the number required for the fourth preferred embodiment detailed above. Accordingly, it is possible to reduce the mass of the movable stage, which means that its speed of movement can be increased.

Preferred Embodiment 7

Figure 18:
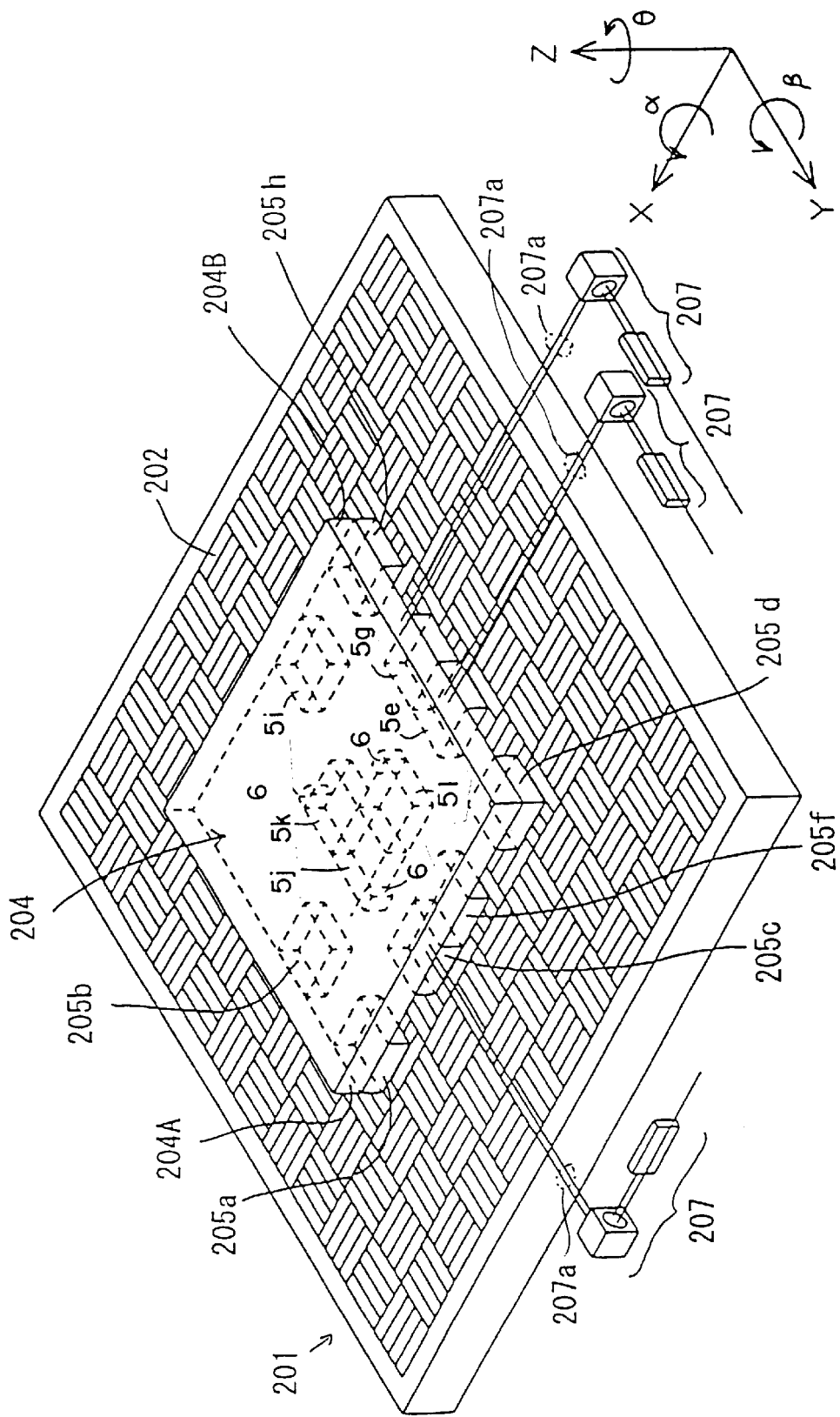
FIG. 18 is a perspective view, similar to FIG. 13 for the sixth preferred embodiment, showing a seventh preferred embodiment of the stage construction incorporating a magnetically levitated movable stage according to the present invention.
Figure 19:
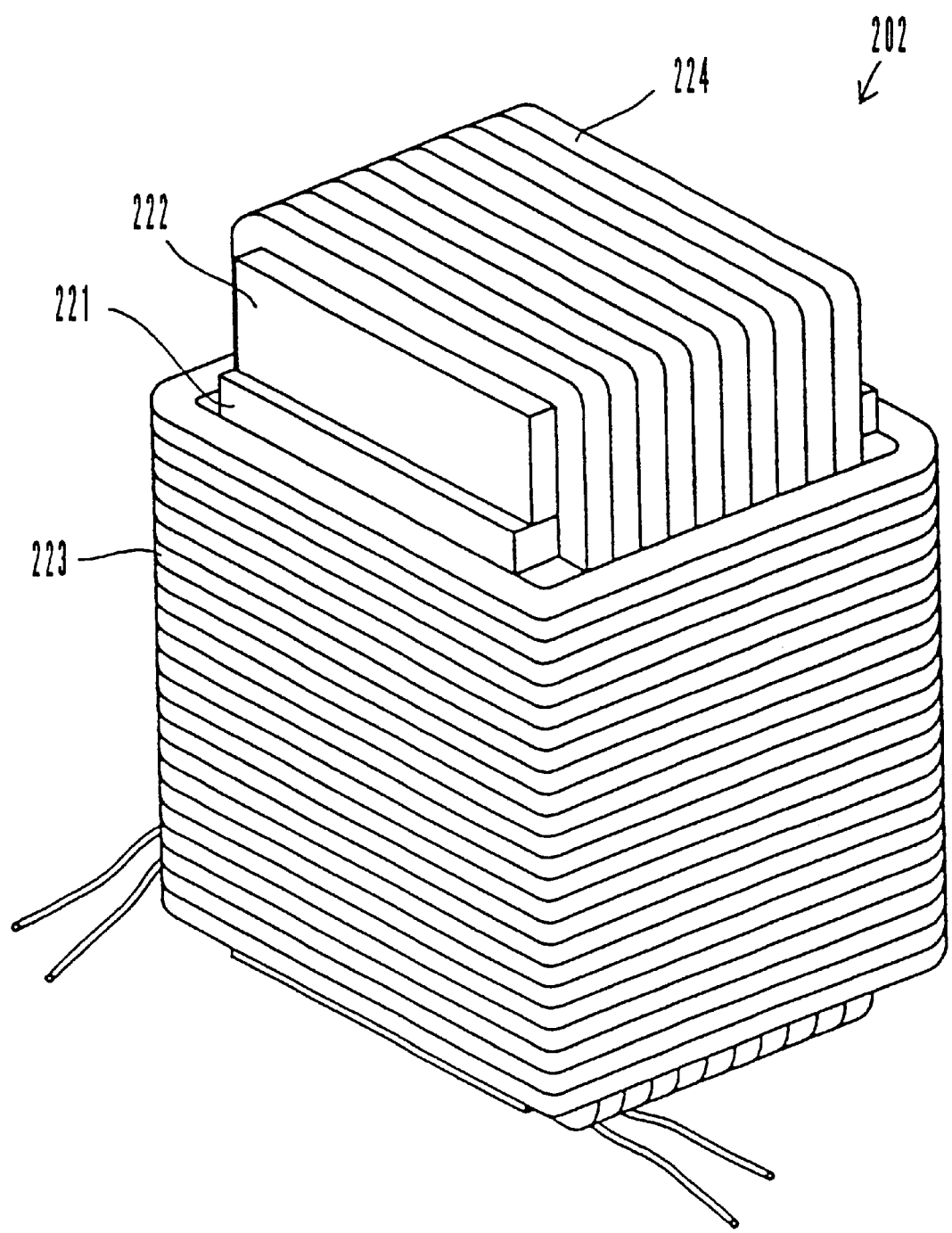
FIG. 19 is a perspective view, similar to FIG. 14 for the sixth preferred embodiment, showing an electromagnet incorporated in this seventh preferred embodiment.
Figure 20:
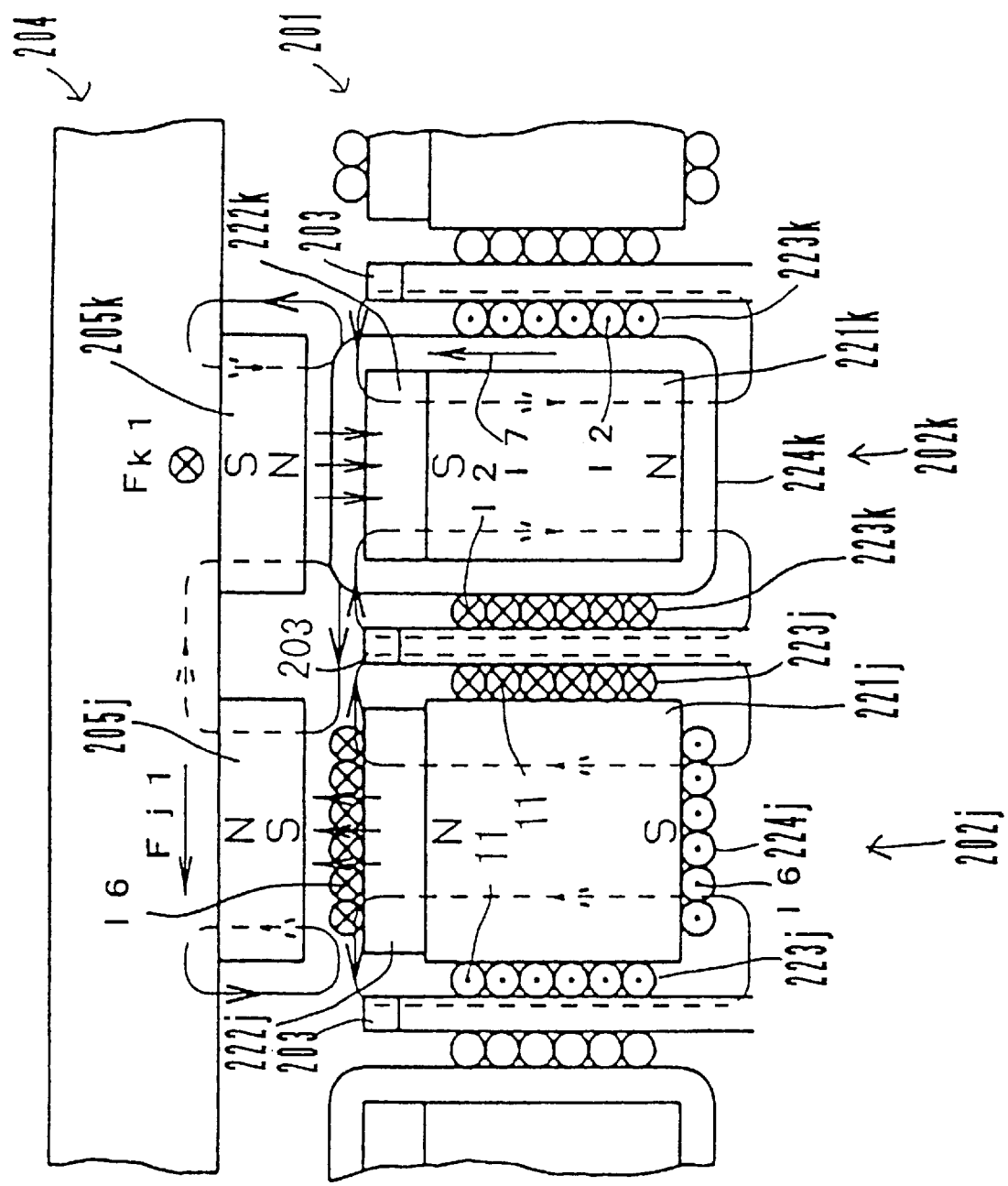
FIG. 20 is a figure, similar to FIG. 16 for the sixth preferred embodiment, showing the principle of operation of this seventh preferred embodiment.

The seventh preferred embodiment of the stage construction incorporating a magnetically levitated movable stage will now be explained with reference to FIGS. 18 through 24. Moreover, FIG. 18 shows a system of orthogonal coordinate axes X, Y, and Z and respectively corresponding rotational direction $\alpha$, $\beta$, and $\theta$ which will be used for describing this seventh preferred embodiment. Further, as is per se conventional, rotation about the a direction will herein be termed "pitching", rotation about the $\beta$ direction will herein be termed "rolling", and rotation about the $\theta$ direction will herein be termed "yawing". As shown in FIG. 18, a plurality of electromagnets 202 are arranged in rows upon a rectangular fixed stage 201. As shown in FIG. 19, each of these electromagnets 202 comprises a core 221 which is a rectangular parallelepiped and a member 222 of material which has a high magnetic permeability superimposed upon the upper portion of this core 221; and a coil 224 is initially wound onto this core 221 around a horizontal direction in the figure, and then a coil 223 is wound on top of this coil 224 around the Z-axis direction; so that the axes of the coil 224 and the coil 223 are perpendicular. In FIG. 18, the parallel lines drawn in the square regions which denote the presence of the electromagnets 202 are for schematically showing the directions of the coils 224 of these electromagnets 202. As shown in this figure, the electromagnets 202 are arranged in a two-dimensional matrix with their coils 224 aligned alternately in checkerboard fashion along the X-axis direction and along the Y-axis direction. As shown in FIG. 20, between neighboring ones of the electromagnets 202 there are fitted Hall elements 203.

Figure 21:
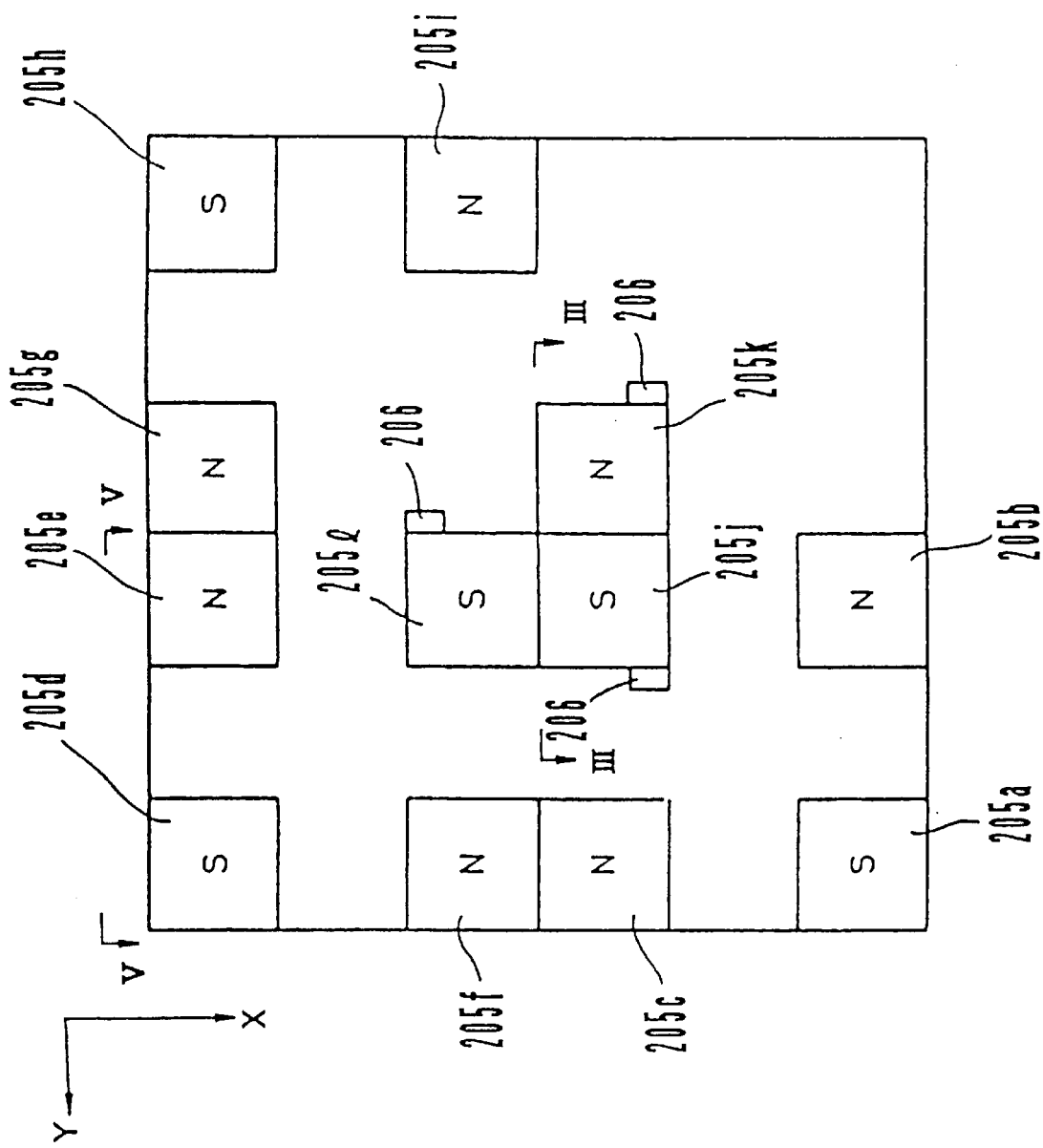
FIG. 21 is a schematic figure, similar to FIG. 15 for the sixth preferred embodiment, showing the under surface of the movable stage of this seventh preferred embodiment.

As shown in FIGS. 18 and 20, a rectangular movable stage 204 which is smaller than the fixed stage 201 is levitated above the fixed stage 201 with a small gap being maintained therebetween. As shown in FIGS. 18 and 21, permanent magnets 205a, 205b, 205c, 205d, 205e, 205f, 205g, 205h, 205i, 205j, 205k, and 205l are provided on the lower surface of the movable stage 204. Seven of these permanent magnets—205b, 205c, 205e, 205f, 205g, 205i, and 205k—are fixed with their N poles pointing in the downwards direction as shown from the point of view of FIG. 18, while the other five permanent magnets—205a, 205d, 205h, 205j, and 205l—are fixed with their S poles pointing in the downwards direction. Further, three gap sensors 206 are fitted to the lower surface of the movable stage 204 and measure the magnitude of the gaps between the movable stage 204 and the fixed stage 201 at the positions where they are mounted. The outputs from these three gap sensors 206 serve for determining the position of the movable stage 204 along the Z axis (the vertical axis), and for determining its angular positions with respect to both the pitch direction a and the roll direction $\beta$.

As shown in FIG. 18, three laser interferometers 207 are provided around of the fixed stage 201. Laser beams 207a which are emitted from the laser interferometers 207 are reflected from mirrors fixed to the side surfaces 204A and 204B of the movable stage 204 and return back to the laser interferometers 207. Thereby these three laser interferometers 207 measure the position of the movable stage 204 along the X and Y axes and also its angular position with respect to the yaw direction θ.

Figure 22:
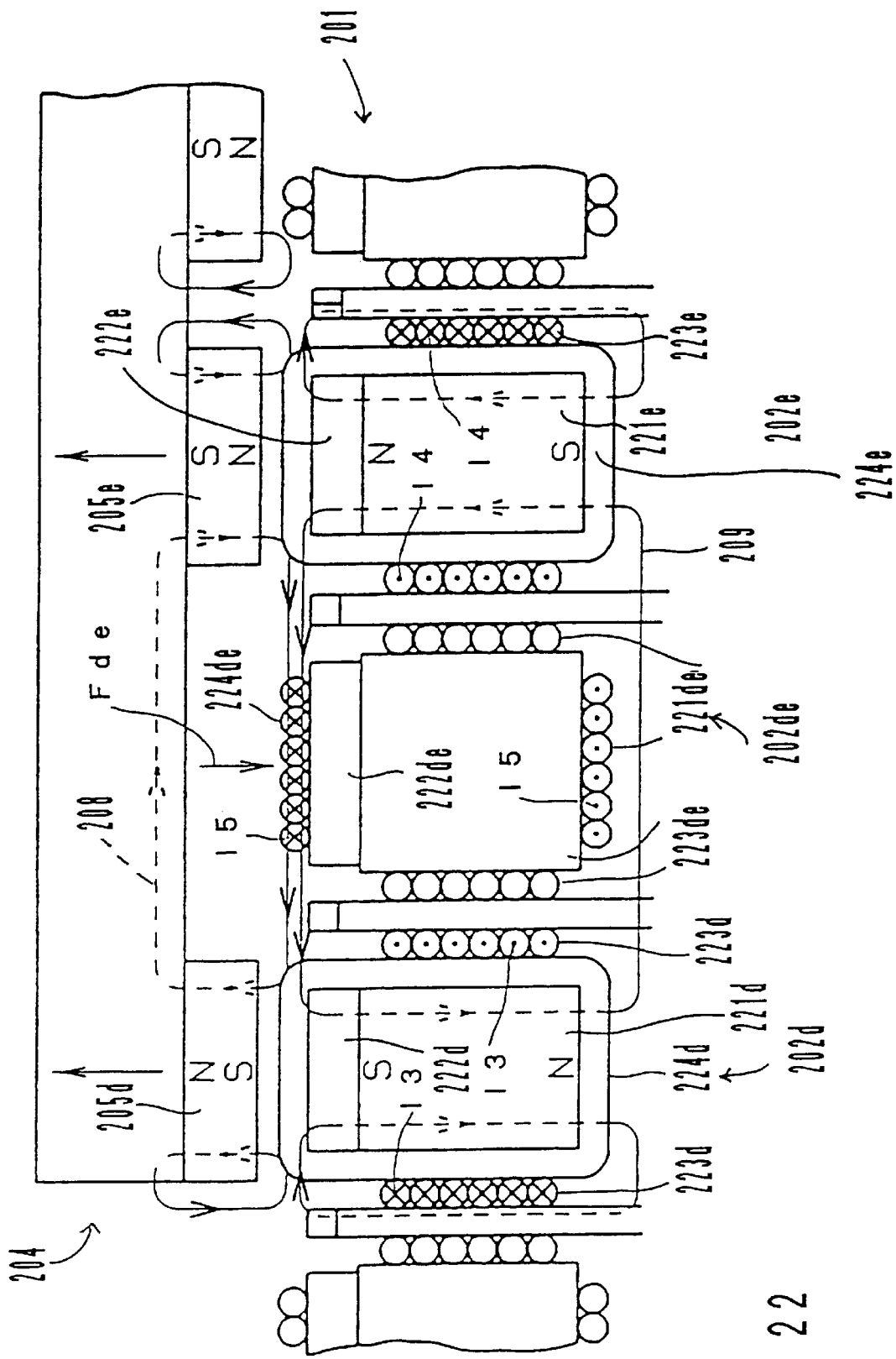
FIG. 22 is another figure, similar to FIG. 20, showing the principle of operation of this seventh preferred embodiment.

In the following, the principles of operation of this seventh preferred embodiment of the stage construction incorporating a magnetically levitated movable stage according to the present invention constructed as described above will be explained with reference to FIGS. 20 and 22. Moreover, FIG. 20 is a sectional view taken along the plane shown by the line III—III in FIG. 21, while FIG. 22 is a sectional view taken along the plane shown by the line V—V in FIG. 21. In FIG. 20, the one of the electromagnets 202 which currently is opposing the permanent magnet 205j will be referred to as 202j, and the one of the electromagnets 202 which currently is opposing the permanent magnet 205k will be referred to as 202k. Further, the core, the member, and the first and the second coils comprised in this electromagnet 202j will be referred to as 221j, 222j, 224j, and 223j respectively, while the core, the member, and the first and the second coils comprised in this electromagnet 202k will be referred to as 221k, 222k, 224k, and 223k respectively.

Referring to FIG. 20, the electrical current I1 in the coil 223j of the electromagnet 202j flows in the clockwise rotational direction as seen from below. Accordingly the core 221j of the electromagnet 202j is magnetized so that its upper end in the figure is an N pole, and an attractive force is thereby engendered between this electromagnet 202j and the opposing permanent magnet 205j upon the movable stage 204 (whose downward facing pole, as stated above, is an S pole). Similarly, the electrical current I2 in the coil 223k of the electromagnet 202k flows in the anticlockwise rotational direction as seen from below, so that its core 221k is likewise magnetized so that its upper end in the figure is an S pole, and therefore an attractive force is also engendered between this electromagnet 202k and the opposing permanent magnet 205k (whose downward facing pole is an N pole).

In FIG. 22, the one of the electromagnets 202 which currently is opposing the permanent magnet 205d will be referred to as 202d, and the one of the electromagnets 202 which currently is opposing the permanent magnet 205e will be referred to as 202e. Further, the one of the electromagnets 202 which is currently located in between the electromagnets 202d and 202e will be referred to as 202de. The core, the member, and the first and second coils comprised in the electromagnet 202d will be referred to as 221d, 222d, 224d, and 223d respectively, and the core, the member, and the first and second coils comprised in the electromagnet 202de will be referred to as 221de, 222de, 224de, and 223de respectively, while the core, the member, and the first and second coils comprised in the electromagnet 202e will be referred to as 221e, 222e, 224e, and 223e respectively.

The electrical current I3 in the coil 223d of the electromagnet 202d flows in the anticlockwise rotational direction as seen from below. Accordingly the core 221a of this electromagnet 202d is magnetized so that its upper end in the figure is an S pole, and a repulsive force is thereby engendered between this electromagnet 202d and the opposing permanent magnet 205d upon the movable stage 204 (whose downward facing pole, as stated above, is also an S pole). On the other hand, the electrical current I4 in the coil 223e of the electromagnet 202e flows in the clockwise rotational direction as seen from below, so that its core 221e is magnetized so that its upper end in the figure is an N pole, and therefore a repulsive force is also engendered between this electromagnet 202e and the opposing permanent magnet 205e (whose downward facing pole is also an N pole).

In FIG. 22, the reference numeral 208 denotes the magnetic flux due to the permanent magnet 205d and the permanent magnet 205e, while 209 denotes the magnetic flux generated by the above described current I3 flowing through the electromagnet 202d and the above described current I4 flowing through the electromagnet 202e. A current I5 is also supplied so as to flow through the coil 224de of the electromagnet 202de in the clockwise rotational direction as seen looking from the right side of FIG. 22, and accordingly, due to Lorentz force, a force in the upwards direction so as to contact to the movable stage 204 is experienced in the upper part of this coil 224de. Since this coil 224de is fixedly attached to the fixed stage 201 which cannot be moved, the movable stage 204 experiences an opposite (attractive) force generated by the Lorentz force, termed "Fde", of equal magnitude in the downwards direction in the figure exerted by the fixed stage 201 (the electromagnet 202de thereof). And it is also possible to reverse the direction of the force Fde by supplying current to the coil 224de in the opposite direction, so as to generate a repulsive force in the upwards direction.

As described above, repulsive force is generated between the electromagnet 202d and the permanent magnet 205d which opposes it, and also between the electromagnet 202e and the permanent magnet 205e which opposes it; while attractive force is generated between the electromagnet 202j and the permanent magnet 205j which opposes it, and also between the electromagnet 202k and the permanent magnet 205k which opposes it. Further, by supplying a current I5 to flow through the coil 224de of the electromagnet 202de an attractive or Lorentz force can be generated between the movable stage 204 and the fixed stage 201. Accordingly, by controlling the directions and magnitudes of these electrical currents and thereby varying the senses and magnitudes of these attractive and repulsive magnetic forces, it is possible to control the amount of displacement of the movable stage 204 in the Z-axis direction and its rotational positions with respect to both the pitch direction α and the roll direction β.

Next, the control of the amount of movement in the X-axis direction and in the Y-axis direction and of the rotational displacement with respect to the yaw direction θ will be explained. As described above, a current I1 flows through the coil 223j of the electromagnet 202j, so that an attractive force is generated between this electromagnet 202j and the permanent magnet 205j (FIG. 20). In this state, a further current I6 is supplied to flow through the coil 224j of the electromagnet 202j in the clockwise rotational direction as seen from the right in the figure. Accordingly, this current I6 flows in the direction perpendicular to the drawing paper and away from the viewer in the portion of this coil 224j which is above the material layer 222j thereof, so that in this portion thereof the coil 224j experiences a force (Lorentz force) from the permanent magnet 205j in the rightwards direction in the figure. In other words, the movable stage 204 (the permanent magnet 205j thereof) experiences an opposite force, termed "Fj1", of equal magnitude in the leftwards direction in the figure exerted by the fixed stage 201 (the electromagnet 202j thereof). The direction and the magnitude of the force Fj1 experienced by the movable stage 204 can be controlled by varying the direction and the magnitude of the current I6 which is flowing through the coil 224j. Further, it is possible to control Fj1 by increasing or decreasing the current I1 which is flowing through the coil 223j, and by varying the attractive force between the electromagnet 202j and the permanent magnet 205j (i.e., by varying the density of the magnetic flux).

On the other hand, as described above, a current I2 flows through the coil 223k of the electromagnet 202k, so that an attractive force is generated between this electromagnet 202k and the permanent magnet 205k. In this state, a further current I7 is supplied to flow through the coil 224k of the electromagnet 202k in the anticlockwise rotational direction, and according to the same principle as described above a force Fk1 is exerted upon the movable stage 204 in the direction perpendicular to the drawing paper and away from the viewer. The direction and the magnitude of this force Fk1 experienced by the movable stage 204 can be controlled in a manner identical to that described above, by varying the direction and the magnitude of the current I7 which is flowing through the coil 224k and the magnitude of the current I2 which is flowing through the coil 223k. By thus varying the forces Fj1 and Fk1 which are generated, the amount of movement of the movable stage 204 in the X-axis direction and in the Y-axis direction, and its rotational displacement with respect to the yaw direction θ, can be appropriately controlled as desired.

Referring to FIG. 21, the permanent magnet 205a opposes the electromagnet 202a (not shown in the figure), the permanent magnet 205b opposes the electromagnet 202b (also not shown in the figure), the permanent magnet 205c opposes the electromagnet 202c (also not shown in the figure), the permanent magnet 205d opposes the electromagnet 202d, the permanent magnet 205e opposes the electromagnet 202e, the permanent magnet 205f opposes the electromagnet 202f (also not shown in the figure), the permanent magnet 205g opposes the electromagnet 202g (also not shown in the figure), the permanent magnet 205h opposes the electromagnet 202h (also not shown in the figure), the permanent magnet 205i opposes the electromagnet 202i (also not shown in the figure), the permanent magnet 205j opposes the electromagnet 202j, the permanent magnet 205k opposes the electromagnet 202k, and the permanent magnet 205l opposes the electromagnet 202l. Further, an electromagnet 202ab (not shown in the figure) is provided between the electromagnet 202a and the electromagnet 202b, an electromagnet 202ac (also not shown in the figure) is provided between the electromagnet 202a and the electromagnet 202c, an electromagnet 202df (also not shown in the figure) is provided between the electromagnet 202d and the electromagnet 202f, an electromagnet 202de is provided between the electromagnet 202d and the electromagnet 202e, an electromagnet 202gh is provided between the electromagnet 202g and the electromagnet 202h, and an electromagnet 202hi (also not shown in the figure) is provided between the electromagnet 202h and the electromagnet 202i.

Figure 23:
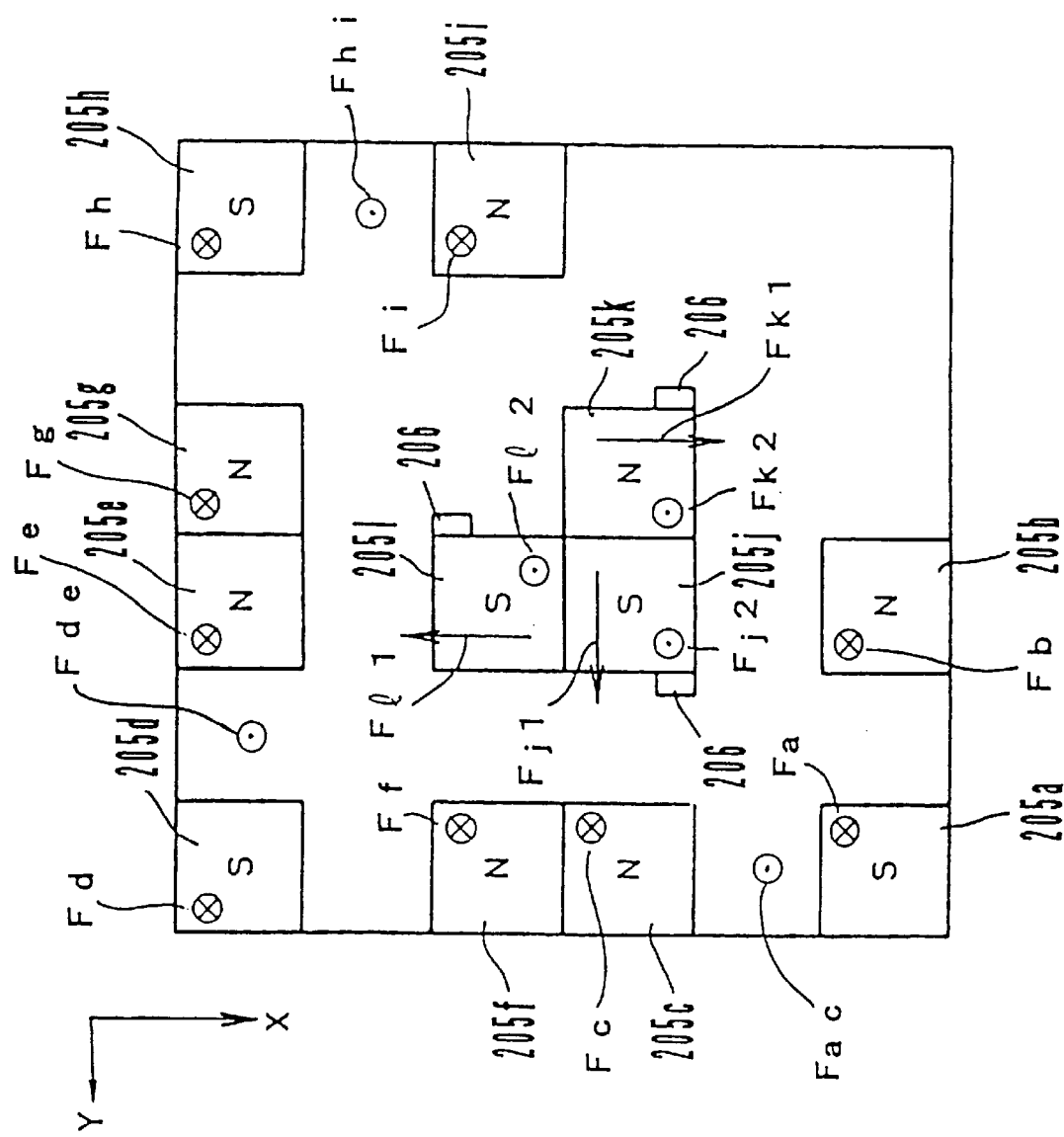
FIG. 23 is a schematic figure, similar to FIG. 17 for the sixth preferred embodiment, particularly showing the forces experienced by the permanent magnets upon the under surface of the movable stage of this seventh preferred embodiment.

FIG. 23 shows the forces which act upon the movable stage 204. The permanent magnets 205a, 205b, 205c, 205d, 205e, 205f, 205g, 205h, and 205i respectively experience forces in the Z-axis direction (repulsive forces) Fa, Fb, Fc, Fd, Fe, Ff, Fg, Fh, and Fi. These repulsive forces can respectively be controlled by varying the currents passing through the respective coils 223a, 223b, 223c, 223d, 223e, 223f, 223g, 223h, and 223i of the respectively opposing electromagnets 202a, 202b, 202c, 202d, 202e, 202f, 202g, 202h, and 202i. Further, the permanent magnets 205j, 205k, and 205l also respectively experience forces (attractive forces) Fj2, Fk2, and Fl2 in the Z-axis direction. These attractive forces are controlled by the currents which flow through the respective coils 223j, 223k, and 223l of the electromagnets 202j, 202k, and 202l. Further, as explained in FIG. 23, the movable stage 204 experiences a force Fde (an attractive force or a repulsive force) in the Z-axis direction via the permanent magnets 205d and 205e due to the current flowing through the coil 224de of the electromagnet 202de. Since the upper portion of the coil 224ac of the electromagnet 202ac is perpendicular to the magnetic flux produced by the permanent magnet 205a and the permanent magnet 205c, the movable stage 204 experiences a force Fac (an attractive force or a repulsive force) in the Z-axis direction due to the current flowing through this coil 224ac. In the same manner, the movable stage 204 experiences a force Fhi (an attractive force or a repulsive force) in the Z-axis direction due to the current flowing through the coil 224hi of the electromagnet 202hi. In this manner, the movable stage 204 experiences the forces Fa, Fb, Fc, Fd, Fe, Ff, Fg, Fh, Fi, Fde, Fac, and Fhi in the Z-axis direction, and thereby its movement in the Z-axis direction as well as its angular positions about the pitch direction α and about the roll direction β can be controlled. Moreover, although in FIG. 23 the forces Fde, Fac, and Fhi were shown as being attractive forces, in actual fact, if the directions of the relevant electrical currents are reversed, they will also operate as repulsive forces.

In the situation shown in FIG. 23, the coil 224ab of the electromagnet 202ab, the coil 224df of the electromagnet 202df, and the coil 224gh of the electromagnet 202gh do not generate any Lorentz force, because their windings are parallel to the magnetic flux which is produced by the permanent magnets which are located to oppose both sides of each of the electromagnets. However, when the movable stage 204 is shifted in the X-axis direction or in the Y-axis direction by a distance just equal to the pitch of the electromagnets 202 fitted to the fixed stage 201, then the windings of these coils 224ab, 224df, and 224gh become perpendicular to the magnetic flux which is emitted by the permanent magnets which are located to oppose both sides of each of the electromagnets now. Accordingly, it is possible to exert an attractive magnetic force in the Z-axis direction upon the movable stage 204 by supplying current to flow in these coils. Moreover, since the coils 224ac of the electromagnet 202ac, 224de of the electromagnet 202de, and 224hi of the electromagnet 202hi which contribute the attractive force in FIG. 23 now become parallel to the magnetic flux, they now cannot generate any attractive force.

As shown in FIG. 23, the permanent magnet 205j experiences a force Fj1 in the Y-axis direction, the permanent magnet 205k experiences a force Fk1 in the X-axis direction, and the permanent magnet 205l experiences a force Fl1 in the X-axis direction. These forces are controlled by the currents which are flowing in the coils 223j and 224j of the electromagnet 202j, in the coils 223k and 224k of the electromagnet 202k, and in the coils 223l and 224l of the electromagnet 202l. Moreover, since the directions of the coils 224 change when the movable stage 204 shifts in the X-axis direction or in the Y-axis direction and the ones of the electromagnets 202 which oppose the permanent magnets 205j, 205k, and 205l change over, therefore at this time the directions of the forces Fj1, Fk1, and Fl1 also alter.

Figure 24:
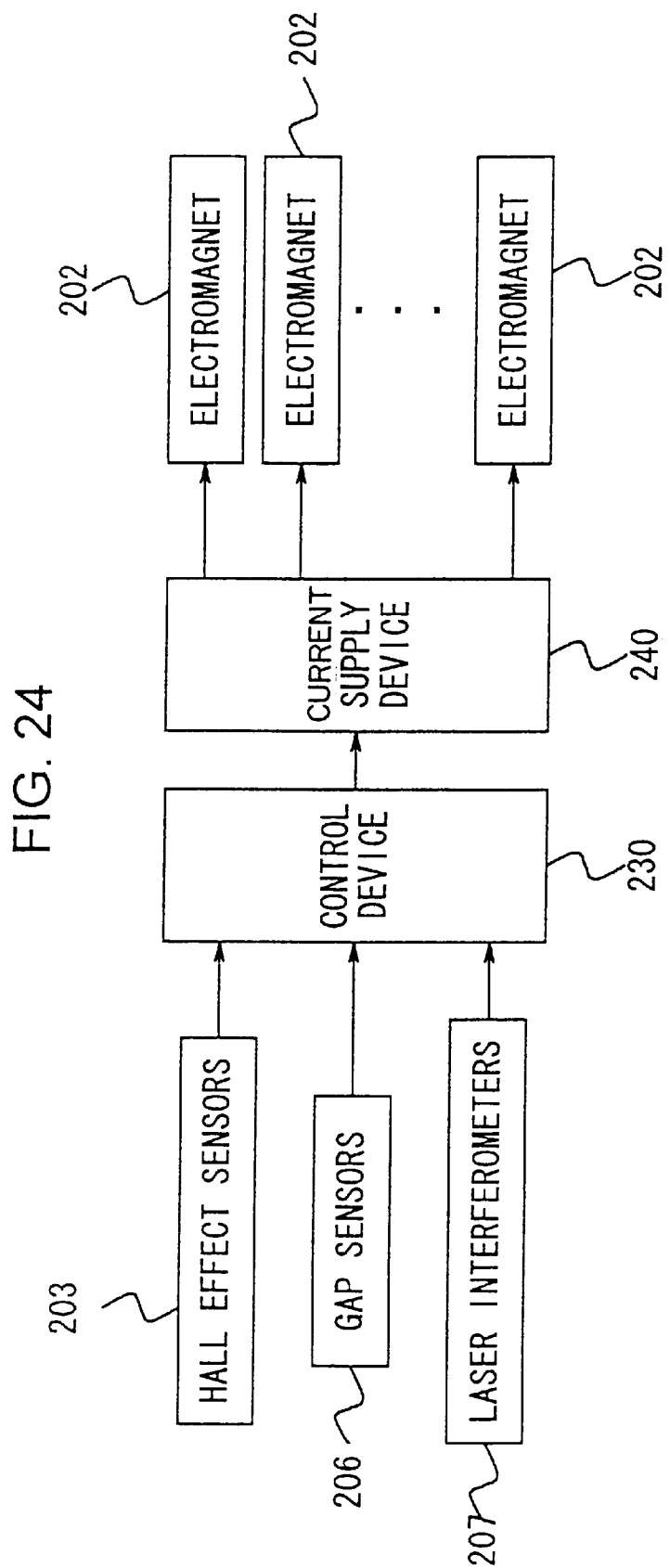
FIG. 24 is a block diagram, similar to FIG. 10 for the fourth preferred embodiment, of a control system for controlling the movement of the movable stage of this seventh preferred embodiment.

As shown in FIG. 24, a control device 230 receives information from the Hall effect sensors 203, the gap sensors 206, and the laser interferometers 207, and controls a current supply device 240 so as to supply electric currents to the various coils of the electromagnets 202, as appropriate.

Here, the Hall effect sensors 203 detect the magnetic fields of the permanent magnets 205 of the movable stage 204 and calculate the positions and magnetic polarities of these permanent magnets 205, and the control device 230 receives this information and determines to which of the coils of the electromagnets 2 electrical currents are to be supplied, and the magnitudes and directions of these electrical currents. Accordingly, without any dependence upon the position of the movable stage 204, appropriate electrical currents can always be supplied to those of the electromagnets 202 which are now opposite to some of the permanent magnets 205, so that the movable stage 204 can be appropriately controlled. Further, the gap sensors 206 measure the gaps between the movable stage 204 and the fixed stage 201, and the control device 230 receives this information and based thereupon controls the magnitudes of the electrical currents appropriately. By doing this, the amount of displacement of the movable stage 204 in the Z-axis direction and its rotational positions with respect to both the pitch direction a and the roll direction β are controlled. Further, the three laser interferometers 207 measure the amount of displacement of the movable stage 204 in the X-axis direction and in the Y-axis direction and its rotational position with respect to the yaw direction θ, and the control device 230 receives this information and determines which of the coils should be supplied with electrical current, and the magnitudes and directions of the electrical currents to be supplied thereto. By doing this, the amount of displacement of the movable stage 204 in the X-axis direction and in the Y-axis direction, and its rotational position with respect to the direction θ are controlled. The method of control which is performed by the control device 230 may be PD control (proportional differential control), PI control (proportional integral control), PID control (proportional integral and differential control), fuzzy control, robust control, or the like.

Although according to the above described construction the amount of displacement of the movable stage 204 along the Z-axis direction and the angular position thereof with respect to both the pitch direction α and the roll direction β were measured using three gap sensors 206, it would also be acceptable, as an alternative, to use four or more such gap sensors 206, in order to enhance the accuracy of measurement. It would also be acceptable to utilize capacitance sensors, eddy-current sensors, laser interferometer sensors, or the like as the gap sensors 206, and these may be used independently or alternatively in groups of two or more. Further, although in this seventh preferred embodiment the gap sensors 206 were fixed to the movable stage 204, it would also be acceptable, as an alternative, to fix the gap sensors to the fixed stage 201. It is also possible to provide plates of high magnetic permeability and of a desirable planarity upon the upper surface of the fixed stage 201 or upon the lower surface of the movable stage 204 (the surface opposing the gap sensors), in order more accurately to measure the gap between the fixed stage 201 and the movable stage 204.

Although in this seventh preferred embodiment the amounts of displacement of the movable stage 204 along the X-axis direction and along the Y-axis direction and the angular position thereof with respect to the yaw direction θ were measured using the laser interferometers 207, it would also be possible to utilize capacitance sensors, eddy-current sensors, or the like instead of these laser interferometers. Further, although in this seventh preferred embodiment three of these laser interferometers 207 were used, it would also be acceptable, as an alternative, to use four or more such laser interferometers as the sensors, in order to enhance the accuracy of measurement.

In this seventh preferred embodiment of the present invention, the electromagnets to which electric current was to be supplied were selected, and the directions of the electric currents to be supplied were determined upon, by detecting the magnetic fields of the permanent magnets 205 fitted to the movable stage 204 using the Hall effect sensors 203 fitted to the fixed stage 201, but this is not fundamental to the concept of the present invention; it would also be possible to omit the Hall effect sensors 203, and instead to use the laser interferometers 207. In this case, since it is possible to calculate the amount of displacement of the movable stage 204 along the X-axis direction and along the Y-axis direction and the angular position thereof with respect to the yaw direction θ using the information from the laser interferometers 207, therefore it is possible to select the electromagnets to which electric current is to be supplied and the directions of the electric currents to be supplied based upon these amounts of linear and angular displacement.

The disposition of the permanent magnets 205 upon the movable stage 204 is not to be considered as limited to the one disclosed in this seventh preferred embodiment. Further, although in the shown preferred embodiment neighboring coils 222 of the electromagnets 202 were oriented alternately in mutually perpendicular directions in checkerboard fashion, this arrangement is not intended to be limitative of the present invention, and it would be acceptable for the arrangement of the permanent magnets 205 upon the movable stage 204 to be suitably selected to correspond to the arrangement of the electromagnets 202 upon the fixed stage 201. Moreover, the number of windings upon the coils 222 and 223 and the density of the windings thereof and so on may be selected as desirable and appropriate. Furthermore, it would also be acceptable to provide special electromagnets for capturing or shielding leaking magnetic flux which is generated by the electromagnets 202 or by the permanent magnets 205. Or, alternatively, it would be possible to provide the permanent magnets upon the fixed stage and the electromagnets upon the movable stage, or both stages could be provided with electromagnets; but by providing permanent magnets upon the movable stage, as in this seventh preferred embodiment, the beneficial effect is obtained that no lead wires for electromagnets need to be provided to the movable stage, which is advantageous with regard to further lightening of the movable stage.

Although in the above described seventh preferred embodiment electromagnets 205j, 205k, and 205l were used, it would also be possible, as an alternative, to utilize elements made from a magnetic material. In this case, in the state in which these magnetic material elements were magnetized by the electric currents flowing through the coils 223j, 223k, and 223l (so that attractive force was generated), it would be possible to control the amount of movement of the movable stage 204 in the X-axis direction and in the Y-axis direction, and the amount of angular displacement thereof with respect to the yaw direction θ, by supplying currents to flow in the coils 222j, 222k, and 222l in appropriate intensities and directions, in a manner similar to that practiced in this seventh preferred embodiment.

Although the above explanation has been made only in terms of the permanent magnets and the electromagnets being directly opposed to one another, if by contrast they are not thus directly mutually opposed, it is also possible to supply electric current to a single electromagnet, or to a plurality of electromagnets, adjacent to each of the permanent magnets. Further, it would also be acceptable to utilize others of the electromagnets which were within the ranges currently reached by the magnetic flux of the permanent magnets for exerting force upon the movable stage.

Although the description of the above described seventh preferred embodiment was made in terms of a movable stage which was levitated and driven above a fixed stage, it would also be possible to levitate the movable stage below the fixed stage, by utilizing attractive magnetic force between them.

Preferred Embodiment 8

Figure 25:
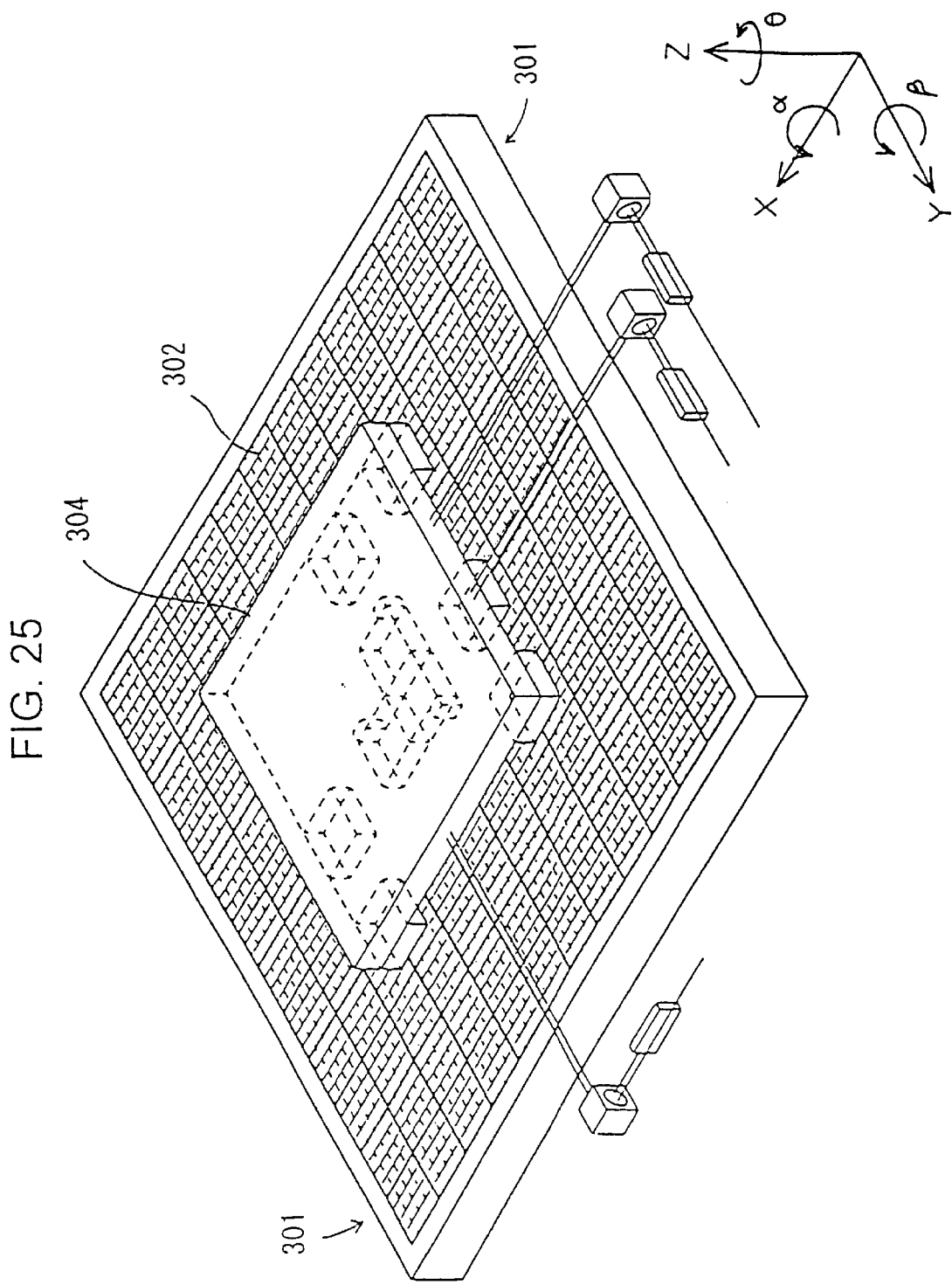
FIG. 25 is a perspective view, similar to FIG. 18 for the seventh preferred embodiment, showing an eighth preferred embodiment of the stage construction incorporating a magnetically levitated movable stage according to the present invention.
Figure 26:
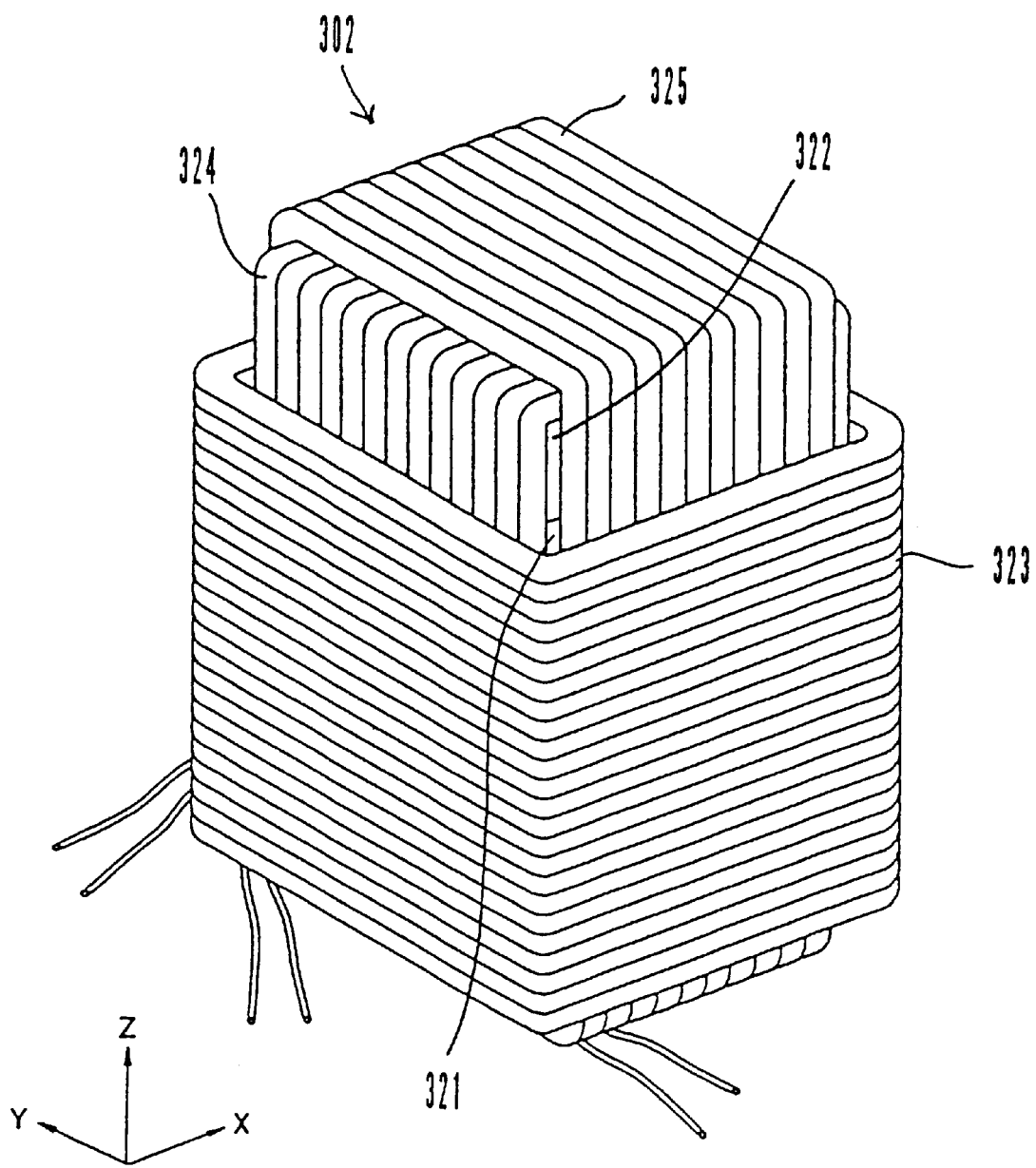
FIG. 26 is a perspective view, similar to FIG. 19 for the seventh preferred embodiment, showing an electromagnet incorporated in this eighth preferred embodiment.
Figure 28:
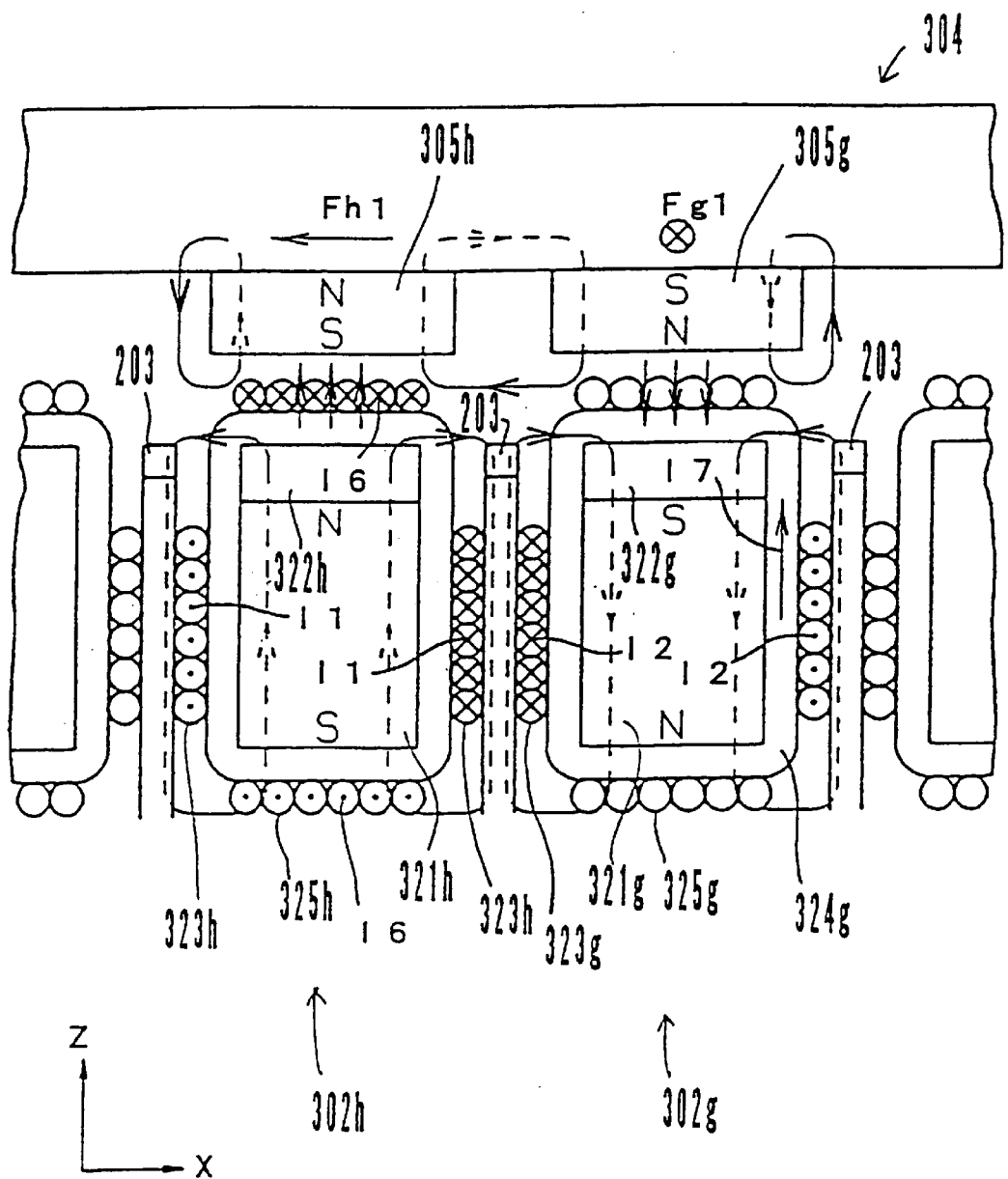
FIG. 28 is a figure, similar to FIG. 20 for the seventh preferred embodiment, showing the principle of operation of this eighth preferred embodiment.

The eighth preferred embodiment of the stage construction incorporating a magnetically levitated movable stage will now be explained. The description of this eighth preferred embodiment will chiefly focus upon the points in which it differs from the seventh preferred embodiment described above; elements of this eighth preferred embodiment which correspond to elements present in the seventh preferred embodiment described above will be denoted by the same reference symbols, and description thereof will be curtailed. As shown in FIG. 25, a plurality of electromagnets 302 are arranged in rows upon a rectangular fixed stage 301. As shown in FIG. 26, each of these electromagnets 302 comprises a core 321 which is a rectangular parallelepiped and a layer 322 of material which has a high magnetic permeability superimposed upon the upper portion of this core 321; and a coil 324 is initially wound onto this core 321 around a horizontal direction in the figure, then another coil 325 is wound over the coil 324 around a horizontal axis perpendicular to the axis of the coil 324, and then a coil 323 is wound on top of this coil 325 around the Z-axis direction; so that the axes of all the three coils 323, 324, and 325 are perpendicular. As shown in FIG. 28, between neighboring ones of the electromagnets 302 there are fitted Hall elements 203.

Figure 27:
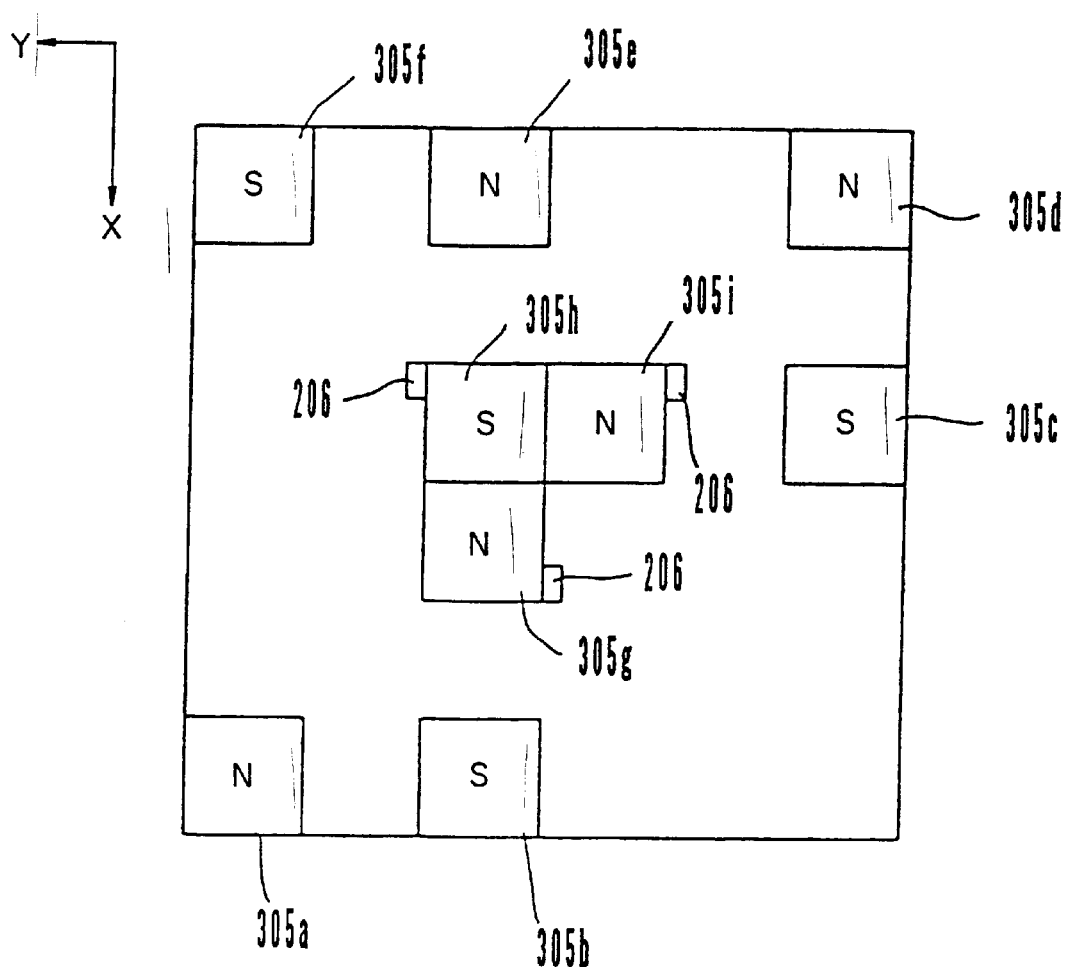
FIG. 27 is a schematic figure, similar to FIG. 21 for the seventh preferred embodiment, showing the under surface of the movable stage of this eighth preferred embodiment.

As shown in FIGS. 25 and 27, permanent magnets 305a, 305b, 305c, 305d, 305e, 305f, 305g, 305h, and 305i are provided on the lower surface of a movable stage 304 which is smaller than the fixed stage 301 and which is levitated above the fixed stage 301 with a small gap being maintained therebetween. Five of these permanent magnets—305a, 305d, 305e, 305g, and 305i—are fixed with their N poles pointing in the downwards direction as seen from the point of view of FIG. 27, while the other four permanent magnets—305b, 305c, 305f, and 305h—are fixed with their S poles pointing in the downwards direction.

In the following, the principles of operation of this eighth preferred embodiment of the stage construction incorporating a magnetically levitated movable stage according to the present invention constructed as described above will be explained with reference to FIGS. 28 and 29. Referring to FIG. 28, the electrical current I1 in the coil 323h of the electromagnet 302h flows in the clockwise rotational direction as seen from below. Accordingly the core 321h of this electromagnet 302h is magnetized so that its upper end in the figure is an N pole, and an attractive force is thereby engendered between this electromagnet 302h and the opposing permanent magnet 305h upon the movable stage 304 (whose downward facing pole, as stated above, is an S pole). On the other hand, the electrical current I2 in the coil 323g of the electromagnet 302g flows in the anticlockwise rotational direction as seen from below. Accordingly the core 321g of this electromagnet 302g is magnetized so that its upper end in the figure is an S pole, and an attractive force is thereby engendered between this electromagnet 302g and the opposing permanent magnet 305g upon the movable stage 304 (whose downward facing pole, as stated above, is an N pole).

Figure 29:
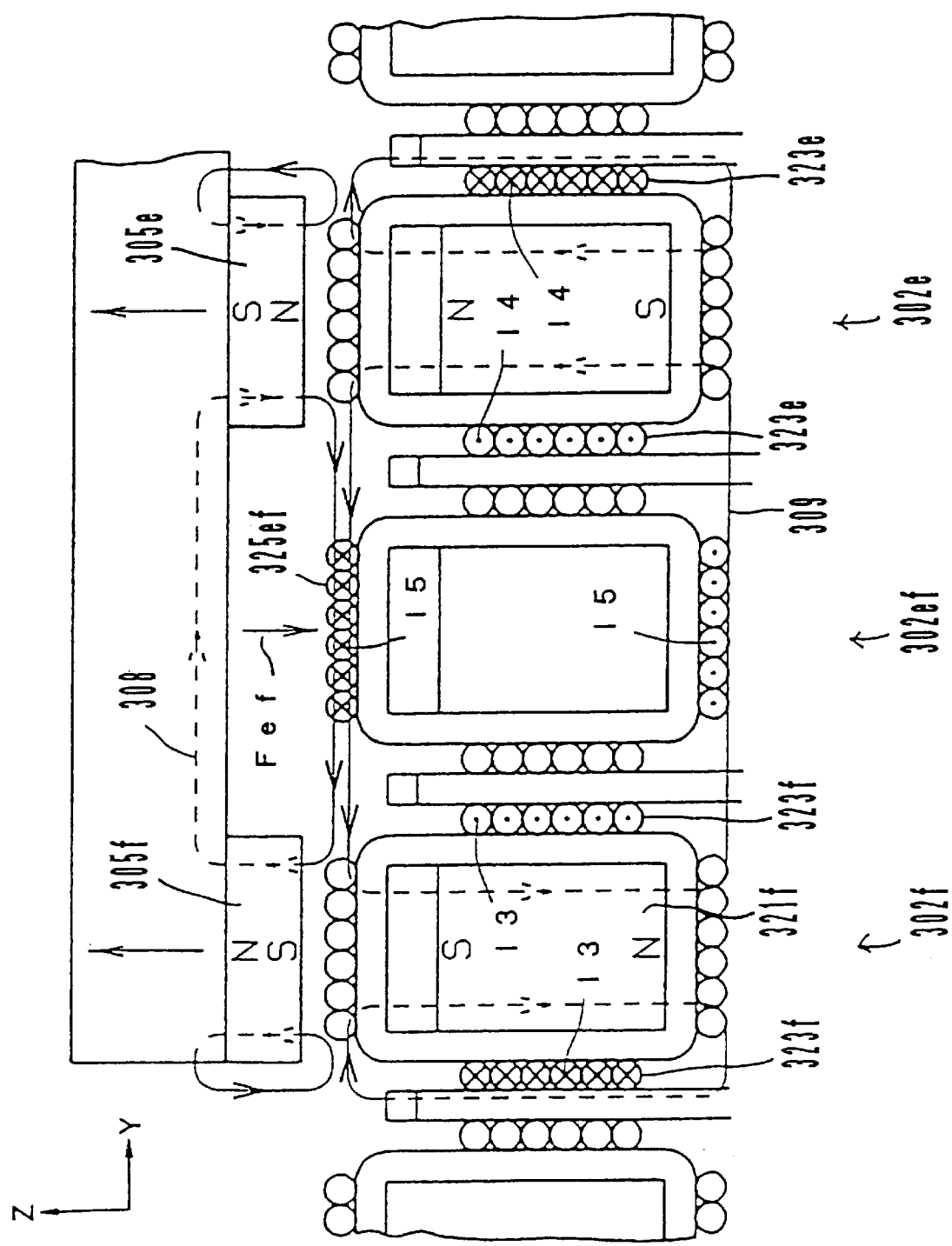
FIG. 29 is another figure, similar to FIG. 28, showing the principle of operation of this eighth preferred embodiment.

Referring to FIG. 29, the permanent magnet 305f opposes the electromagnet 302f, and the permanent magnet 305e opposes the electromagnet 302e. Further, the electromagnet 302ef is interposed between the electromagnet 302e and the electromagnet 302f. An electrical current I3 in the coil 323f of the electromagnet 302f flows in the anticlockwise rotational direction as seen from below. Accordingly, the core 321f of this electromagnet 302f is magnetized so that its upper end in the figure is an S pole, and a repulsive force is thereby engendered between this electromagnet 302f and the opposing permanent magnet 305f upon the movable stage 304 (whose downward facing pole, as stated above, is an S pole). Further, an electrical current I4 in the coil 323e of the electromagnet 302e flows in the clockwise rotational direction as seen from below. Accordingly in the same manner a repulsive force is thereby engendered between this electromagnet 302e and the opposing permanent magnet 305e (whose downward facing pole, as stated above, is an N pole). The reference numeral 308 denotes the magnetic flux generated by the permanent magnet 305f and the permanent magnet 305e. And 309 denotes the magnetic flux due as explained above to the current I3 flowing through the electromagnet 302f and to the current I4 flowing through the electromagnet 302e. A current I5 flows in the coil 325ef in the clockwise rotational direction as seen from the right side of FIG. 29, and thereby in the upper portion of the coil 325ef a force due to the Lorentz force will operate in the direction (the upwards direction) so as to bring it into contact with the movable stage 304. Since the coil 325ef is fixed to the fixed stage 301, a force Fef (an attractive force) of equal magnitude and in the opposite (downward) direction to this Lorentz force will be experienced by the movable stage 304. And, by causing the current to flow through the coil 325ef in the opposite direction, a repulsive force opposite in direction to this force Fef will be generated.

As described above, a repulsive magnetic force is generated between the electromagnet 302f and the mutually opposing permanent magnet 305f, and between the electromagnet 302e and the mutually opposing permanent magnet 305e; while an attractive magnetic force is generated between the electromagnet 302h and the permanent magnet 305h, and between the electromagnet 302g and the permanent magnet 305g. Further, an attractive force is generated between the movable stage 304 and the fixed stage 301 due to the current I5 which flows in the coil 325ef of the electromagnet 302ef. Accordingly, if these attractive and repulsive forces are controlled by controlling the magnitudes and directions of the electrical currents which are thus supplied, it is possible to control the position of the movable stage 304 in the Z-axis direction, and its angular positions with respect to the pitch direction α and the roll direction β.

Next, the manner in which the position of the movable stage 304 along the X-axis direction, its position along the Y-axis direction, and its rotational position with respect to the yaw direction θ are controlled will be explained. The current I1 which is flowing through the coil 323h of the electromagnet 302h generates an attractive magnetic force between the electromagnet 302h and the permanent magnet 305h, as shown in FIG. 28. In this state, an electrical current I6 is also flowed through the coil 325h in the clockwise rotational direction as seen from the right of the figure. Accordingly, as has been explained above with reference to the seventh preferred embodiment, the movable stage 304 experiences a force Fh1 in the leftward direction in the figure.

On the other hand, as also described above, the current I2 flowing in the coil 323g of the electromagnet 302g generates an attractive force between this electromagnet 302g and the opposing permanent magnet 302g. In this state, when a current I7 is also supplied to flow through the coil 324g of this electromagnet 302g in the anticlockwise rotational direction as seen in the figure, then according to a principle identical to that described above the movable stage 304 (the permanent magnet 305g thereof) experiences a force, termed "Fg1", in the direction perpendicular to the drawing paper and away from the viewer. By varying these forces Fh1 and Fg1, it is possible to control the position of the movable stage 304 along the X-axis direction, its position along the Y-axis direction, and its rotational position with respect to the yaw direction θ.

Figure 30:
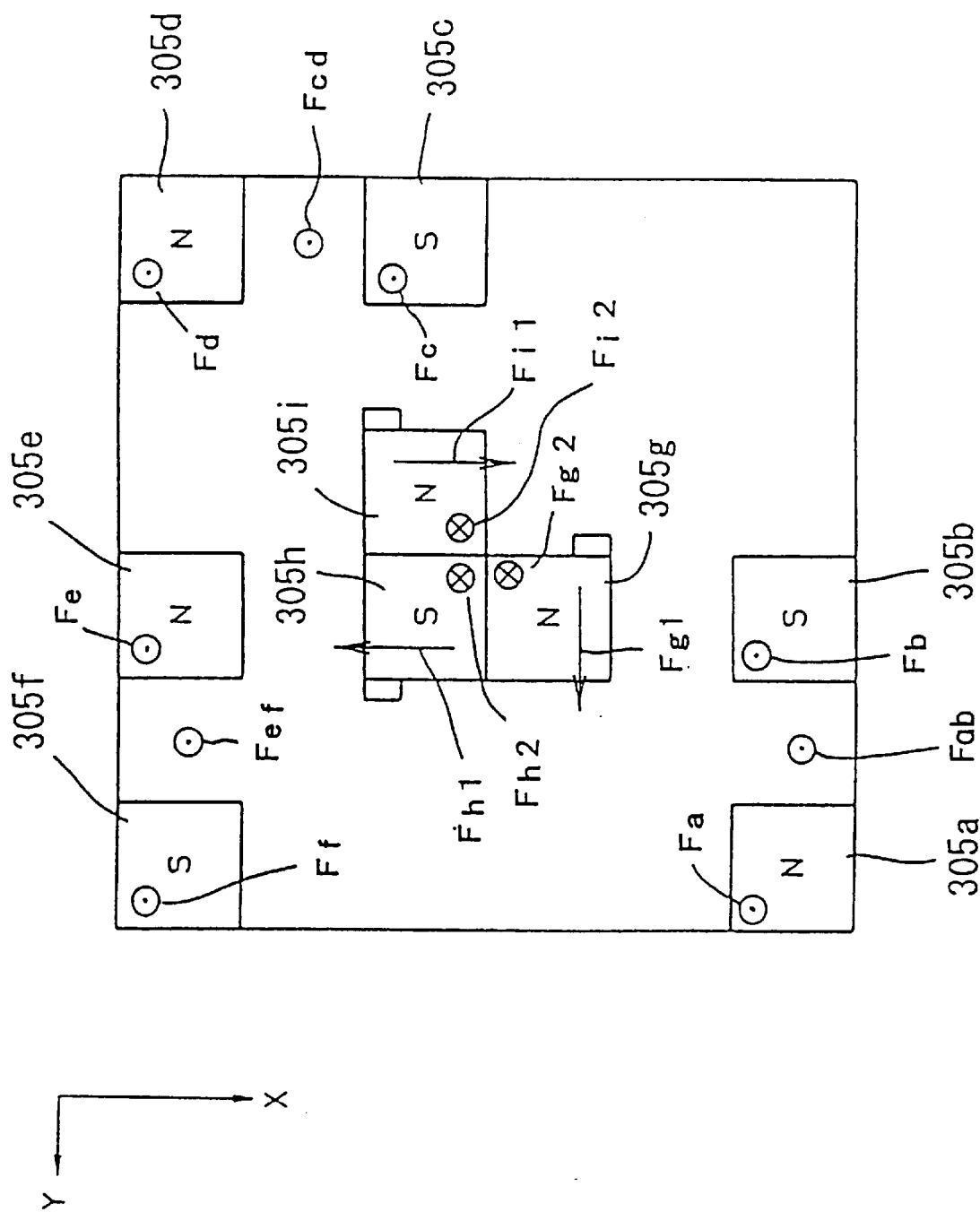
FIG. 30 is a schematic figure, similar to FIG. 23 for the seventh preferred embodiment, particularly showing the forces experienced by the permanent magnets upon the under surface of the movable stage of this eighth preferred embodiment.

FIG. 30 shows the forces which are experienced by the permanent magnets 305 mounted upon the movable stage 304. The permanent magnet 305a is opposed to the electromagnet 302a, the permanent magnet 305b is opposed to the electromagnet 302b, the permanent magnet 305c is opposed to the electromagnet 302c, the permanent magnet 305d is opposed to the electromagnet 302d, the permanent magnet 305e is opposed to the electromagnet 302e, the permanent magnet 305f is opposed to the electromagnet 302f, the permanent magnet 305g is opposed to the electromagnet 302g, the permanent magnet 305h is opposed to the electromagnet 302h, and the permanent magnet 305i is opposed to the electromagnet 302i. Further, the electromagnet 302ab is provided between the electromagnet 302a and the electromagnet 302b, the electromagnet 302cd is provided between the electromagnet 302c and the electromagnet 302d, and the electromagnet 302ef is provided between the electromagnet 302e and the electromagnet 302f.

The permanent magnets 305a, 305b, 305c, 305d, 305e, and 305f experience the respective attractive forces Fa, Fb, Fc, Fd, Fe, and Ff in the Z-axis direction. Further, the permanent magnets 305g, 305h, and 305i experience the respective repulsive forces Fg2, Fh2, and Fi2 in the Z-axis direction. Moreover, a force Fab (an attractive or a repulsive force) along the Z-axis direction is experienced due to the current flowing in the coil 325ab of the electromagnet 302ab, a force Fcd (an attractive or a repulsive force) along the Z-axis direction is experienced due to the current flowing in the coil 325cd of the electromagnet 302cd, and a force Fef (an attractive or a repulsive force) along the Z-axis direction is experienced due to the current flowing in the coil 325ef of the electromagnet 302ef.

As shown in FIG. 30, the permanent magnet 305g experiences a force Fg1 in the Y-axis direction, the permanent magnet 305h experiences a force Fh1 in the X-axis direction, and the permanent magnet 305i experiences a force Fi1 in the X-axis direction.

In this eighth preferred embodiment, the electromagnet 302 is provided with three coils which are wound around it in three perpendicular directions (the X-axis direction, the , the Y-axis direction, and the Z-axis direction). Due to this, it is possible effectively to utilize the attractive, repulsive, and Lorentz forces of the magnets themselves without any dependence upon the position of the movable stage, and it is possible to reduce the number of permanent magnets upon the movable stage. Accordingly, it is possible to lighten the movable stage, and thereby its speed of movement can be increased.

In the claims relating to this invention, the term "magnet" is intended to be a concept which includes the case of a magnetic material which can be magnetized when the movable stage is to be driven, and is not to be considered as being limited to the concept of a permanent magnet. It would also be possible to use a superconducting material for the magnets, or for the electromagnets. Further, "magnetic material" is intended to be a concept which includes the case of a permanent magnet. Other variations in any embodiment of the present invention might be made, without departing from its essential scope. Accordingly, although the present invention has been shown and described in terms of several preferred embodiments thereof, it is not to be considered as limited by any of the perhaps quite fortuitous details of said embodiments or of the drawings, but only by the terms of the appended claims, which follow.

What is claimed is:

1. A stage device comprising:
   a fixed stage including:
   (a) a magnet member to generate a magnetic force; and
   (b) a closed plenum to seal said magnet member therein, said closed plenum having a two-dimensional plane;
   a movable stage to move, in response to said magnetic force, above said two-dimensional plane; and
   a position detector that detects a position of said movable stage, at least a part of said position detector being fixed to said movable stage.

2. A stage device according to claim 1, wherein at least a part of said fixed stage is made from a material of low magnetic permeability.

3. A stage device according to claim 1, wherein said movable stage comprises a magnetic material which is opposed to said magnet member and which experiences an attractive or repulsive magnetic force with respect to said magnet member.

4. A stage device according to claim 1, wherein said movable stage is a guideless stage.

5. A stage device according to claim 1, wherein said two-dimensional plane includes a first linear direction, a second linear direction and a rotative direction on its axis.

6. A stage device according to claim 1, wherein said movable stage moves in a Z-direction perpendicular to said two-dimensional plane.

7. A stage device according to claim 1, wherein said magnetic force comprises Lorentz force.

8. A stage device according to claim 1, wherein said position detector comprises an interferometer.

9. A stage device according to claim 1, wherein said position detector comprises a reflex member fixed to said movable stage.

10. A stage device according to claim 1, further comprising
    a controller that controls said magnet member to generate said magnetic force based upon the position of said movable stage detected by said position detector.

11. A stage device comprising:
    a fixed stage including:
    (a) a coil member to generate a magnetic force; and
    (b) a closed plenum to seal said coil member therein, said closed plenum having a two-dimensional plane; and
    a movable stage to move, in response to said magnetic force above said two-dimensional plane; and
    a position detector that detects a position of said movable stage, at least a part of said position detector being fixed to said movable stage.

12. A stage device according to claim 11, wherein at least a part of said fixed stage is made from a material of low magnetic permeability.

13. A stage device according to claim 12, further comprising a fluid supply device that supplies a fluid to said plenum to cool the coil member.

14. A stage device according to claim 13, wherein said fixed stage comprises a coolant conduit, connected to said fluid supply device, that is made from a material which has low magnetic permeability.

15. A stage device according to claim 12, wherein a coolant medium is supplied to said plenum.

16. A stage device according to claim 15, wherein a surface of said coil member is covered with a material which has a high thermal conductivity efficiency.

17. A stage device according to claim 15, further comprising a fluid supply device that supplies a fluid to said plenum to cool the coil member.

18. A stage device according to claim 17, wherein said fixed stage comprises a coolant conduit, connected to said fluid supply device, that is made from a material which has low magnetic permeability.

19. A stage device according to claim 11, wherein a coolant medium is supplied to said plenum.

20. A stage device according to claim 19, wherein a surface of said coil member is covered with a material which has a high thermal conductivity efficiency.

21. A stage device according to claim 19, further comprising a fluid supply device that supplies a fluid to said plenum to cool the coil member.

22. A stage device according to claim 21, wherein said fixed stage comprises a coolant conduit, connected to said fluid supply device, that is made from a material which has low magnetic permeability.

23. A stage device according to claim 11, further comprising a fluid supply device that supplies a fluid to said plenum to cool the coil member.

24. A stage device according to claim 23, wherein said fixed stage comprises a coolant conduit, connected to said fluid supply device, that is made from a material which has low magnetic permeability.

25. A stage device according to claim 11, wherein said movable stage is a guideless stage.

26. A stage device according to claim 11, wherein said two-dimensional plane includes a first linear direction, a second linear direction and a rotative direction on its axis.

27. A stage device according to claim 11, wherein said movable stage moves in a Z-direction perpendicular to said two-dimensional plane.

28. A stage device according to claim 11, wherein said magnetic force comprises Lorentz force.

29. A stage device according to claim 11, wherein said position detector comprises an interferometer.

30. A stage device according to claim 11, wherein said position detector comprises a reflux member fixed to said movable stage.

31. A stage device according to claim 11, further comprising
a controller that controls said magnet member to generate said magnetic force based upon the position of said movable stage detected by said position detector.

32. A stage device comprising:
a fixed stage;
a movable stage to move among a plurality of predetermined positions in a two-dimensional plane;
a plurality of magnets disposed on one among said fixed stage and said movable stage;
a plurality of coils disposed on one among said fixed stage and said movable stage;
a closed plenum to seal said plurality of coils therein, said plenum having a plane substantially parallel to the two-dimensional plane;
a fluid supply device, connected to said plenum, that cools said plurality of coils; and
a position detector that detects a position of said movable stage, at least a part of said position detector being fixed to said movable stage.

33. A stage device according to claim 32 wherein
said plenum is disposed at least in part between said magnets and said coils and is made from material of low magnetic permeability.

34. A stage device according to claim 32, wherein
said coils are covered by a corrosion damage avoiding member.

35. A stage device according to claim 34, wherein
said corrosion damage avoiding member includes TEFLON.

36. A stage device according to claim 32, wherein
said coils are covered by a member having a high thermal conductivity efficiency.

37. A stage device according to claim 32, wherein said movable stage is a guideless stage.

38. A stage device according to claim 32, wherein said two-dimensional plan includes a first linear direction, a second linear direction and a rotative direction on its axis.

39. A stage device according to claim 32, wherein said movable stage moves in a Z-direction perpendicular to said two-dimensional plane.

40. A stage device according to claim 32, wherein said magnetic force comprises Lorentz force.

41. A stage device according to claim 32, wherein said position detector comprises an interferometer.

42. A stage device according to claim 32, wherein said position detector comprises a reflex member fixed to said movable stage.

43. A stage device according to claim 32, further comprising
a controller that controls the plurality among said plurality of magnets and said plurality of coils that is disposed on said fixed stage to move said movable stage based upon the position of said movable stage detected by said position detector.

44. A stage incorporating a magnetically levitated movable stage, having a fixed stage and a magnetically levitated movable stage which is driven with respect to said fixed stage by magnetic action between said movable stage and said fixed stage, said stage comprising:
a plurality of magnets disposed on one of said fixed stage and said movable stage;
a plurality of coils disposed on the other said fixed stage and said movable stage;
a first plenum which seals said plurality of coils;
a second plenum different from said first plenum which surrounds said plurality of coils; and
a coolant medium supplied to said second plenum.

45. A stage incorporating a magnetically levitated movable stage according to claim 44, wherein
said first plenum is disposed between said magnets and said coils and is made from a material of low magnetic permeability.

46. A stage incorporating a magnetically levitated movable stage according to claim 44, wherein
said coils are covered a corrosion damage avoiding member.

47. A stage incorporating a magnetically levitated movable stage according to claim 46, wherein
said corrosion damage avoiding member includes TEFLON.

48. A stage incorporating a magnetically levitated movable stage according to claim 44, wherein
said coils are covered a member having a high thermal conductivity efficiency.

* * * * *